(12) United States Patent
Shinohara et al.

(10) Patent No.: US 10,389,387 B2
(45) Date of Patent: Aug. 20, 2019

(54) CODING DEVICE AND CODING METHOD FOR A DVB-LIKE LDPC CODE AND A LDPC CODE IN AN ETRI FORMAT

(71) Applicant: SONY SEMICONDUCTOR SOLUTIONS CORPORATION, Kanagawa (JP)

(72) Inventors: Yuji Shinohara, Kanagawa (JP); Makiko Yamamoto, Tokyo (JP); Ryoji Ikegaya, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/570,815

(22) PCT Filed: May 6, 2016

(86) PCT No.: PCT/JP2016/063619
§ 371 (c)(1),
(2) Date: Oct. 31, 2017

(87) PCT Pub. No.: WO2016/185911
PCT Pub. Date: Nov. 24, 2016

(65) Prior Publication Data
US 2018/0159557 A1    Jun. 7, 2018

(30) Foreign Application Priority Data
May 19, 2015 (JP) ................. 2015-101572

(51) Int. Cl.
*H03M 13/00* (2006.01)
*H03M 13/11* (2006.01)
(Continued)

(52) U.S. Cl.
CPC ... *H03M 13/2792* (2013.01); *H03M 13/1148* (2013.01); *H03M 13/19* (2013.01); *H03M 13/27* (2013.01); *H03M 13/616* (2013.01)

(58) Field of Classification Search
CPC .......... H03M 13/2792; H03M 13/616; H03M 13/1148; H03M 13/19; H03M 13/27
See application file for complete search history.

(56) References Cited

U.S. PATENT DOCUMENTS

| 8,819,518 B2* | 8/2014 | Stewart | H03M 13/1105 |
| | | | 714/758 |
| 2009/0119568 A1* | 5/2009 | Shen | H03M 13/09 |
| | | | 714/781 |

(Continued)

FOREIGN PATENT DOCUMENTS

| CN | 101164241 A | 4/2008 |
| CN | 101490964 A | 7/2009 |

(Continued)

OTHER PUBLICATIONS

Kim, et al., "Low-Density Parity-Check Codes for ATSC 3.0", IEEE Transactions on Broadcasting, vol. 62, No. 1, Mar. 2016, pp. 189-196.

(Continued)

*Primary Examiner* — Cynthia Britt
(74) *Attorney, Agent, or Firm* — Chip Law Group

(57) ABSTRACT

The present technology relates to a coding device and a coding method that makes it possible to correspond to a DVB-Like LDPC code and an LDPC code in an ETRI format. A coding device includes: a first LDPC coding unit configured to generate an LDPC code of a predetermined information word by using a first parity check matrix; a first parity interleaving unit configured to interleave a parity bit of the LDPC code; and a second LDPC coding unit configured to generate an LDPC code in an ETRI format by using (Continued)

a second parity check matrix with respect to the LDPC code in which the parity bit is interleaved. The present technology can be applied, for example, to a coding device or the like.

4 Claims, 29 Drawing Sheets

(51) Int. Cl.
*H03M 13/19* (2006.01)
*H03M 13/27* (2006.01)

(56) References Cited

U.S. PATENT DOCUMENTS

| | | | |
|---|---|---|---|
| 2009/0217122 | A1 | 8/2009 | Yokokawa et al. |
| 2010/0180176 | A1 | 7/2010 | Yosoku et al. |
| 2013/0151921 | A1 | 6/2013 | Uchikawa et al. |
| 2016/0164540 | A1* | 6/2016 | Shinohara ........... H03M 13/1102 714/752 |
| 2016/0204804 | A1* | 7/2016 | Ikegaya ............... H03M 13/036 714/752 |
| 2016/0218746 | A1* | 7/2016 | Park ................... H03M 13/2792 |
| 2016/0241271 | A1* | 8/2016 | Park ................... H03M 13/1105 |

FOREIGN PATENT DOCUMENTS

| | | |
|---|---|---|
| EP | 1876717 A1 | 1/2008 |
| JP | 2006-304132 A | 11/2006 |
| JP | 2008-086008 A | 4/2008 |
| JP | 2013-126028 A | 6/2013 |
| KR | 10-2008-0005511 A | 1/2008 |
| WO | 2006/115166 A1 | 11/2006 |
| WO | 2008/026740 A1 | 3/2008 |

OTHER PUBLICATIONS

"Digital Video Broadcasting (DVB); Second Generation Framing Structure, Channel Coding and Modulation Systems for Broadcasting, Interactive Services, News Gathering and Other Broadband Satellite Applications (DVB-S2)", European Standard (Telecommunications series), ETSI EN 302 307 vol. 1.2.1, Aug. 2009, 78 pages.
"Digital Video Broadcasting (DVB); Frame Structure Channel Coding and Modulation for a Second Generation Digital Terrestrial Television Broadcasting System (DVB-T2)", ETSI EN 302 755 vol. 1.3.1, Apr. 2012, 188 pages.
International Search Report and Written Opinion of PCT Application No. PCT/JP2016/063619, dated Jun. 21, 2016, 06 pages of English Translation and 06 pages of ISRWO.
International Preliminary Report on Patentability of PCT Application No. PCT/JP2016/063619, dated Nov. 30, 2017, 06 pages of English Translation and 03 pages of IPRP.
"Digital Video Broadcasting (DVB); Second generation framing structure, channel coding and modulation systems for Broadcasting, Interactive Services, News Gathering and other broadband satellite applications (DVB-S2)", ETSI EN 302 307 V1.2.1, Aug. 2009, pp. 78.
"Digital Video Broadcasting (DVB); Frame stricture channel coding and modulation for a second generation digital terrestrial television broadcasting system (DVB-T2)", ETSI EN 302 755 V1.3.1, Apr. 2012, pp. 188.
Kim, et al., "Low-Density Parity-Check Codes for ATSC 3.", IEEE Transactions on Broadcasling vol. 62, Issue 1, Mar. 2016, pp. 189-196.

* cited by examiner

$$H = \begin{bmatrix} h(0,0) & h(0,1) & \ldots & h(0,k-1) & 1 & 0 & 0 & \ldots & 0 \\ h(1,0) & h(1,1) & \ldots & h(1,k-1) & h(1,k) & 1 & 0 & \ldots & 0 \\ \vdots & \vdots & & \vdots & \vdots & \vdots & \vdots & & \vdots \\ h(n-k-1,0) & h(n-k-1,1) & \ldots & h(n-k-1,k-1) & h(n-k-1,k) & \ldots & \ldots & h(n-k-1,n-2) & 1 \end{bmatrix}$$

$$\underbrace{\phantom{h(0,0) \quad h(0,1) \quad \ldots \quad h(0,k-1)}}_{\text{INFORMATION PART}} \underbrace{\phantom{1 \quad 0 \quad 0 \quad \ldots \quad 0}}_{\text{PARITY PART}}$$

|   | 0   | 1   | 2   | 3 | 4 | 5 | 6 | 7 | 8 | 9    | 10   | 11 |
|---|-----|-----|-----|---|---|---|---|---|---|------|------|----|
| 0 | 0   | —   | —   | — | 1 | 3 | 0 | — | 1 | —    | 3    | 2  |
| 1 | 2,4 | 0,5 | —   | — | — | — | — | 0 | 3 | —    | —    | 4  |
| 2 | —   | 1   | 0,5 | 0 | 1 | — | 3 | — | 0 | —    | —    | —  |
| 3 | 3   | —   | 0,4 | 0 | — | — | 0 | — | — | 0,3  | —    | —  |
| 4 | —   | 0,3 | —   | — | 0 | 3 | — | 4 | — | —    | 0,1  | —  |
| 5 | 5   | —   | 1   | 0 | — | 0 | — | 2 | — | 0    | —    | 0  |

FIG. 11

|  | ZEROTH ADDRESS | FIRST ADDRESS | SECOND ADDRESS | THIRD ADDRESS | FOURTH ADDRESS | FIFTH ADDRESS |
|---|---|---|---|---|---|---|
| ZEROTH BIT | o0, 0 | o0, 1 | o0, 2 | o0, 3 | o0, 4 | o0, 5 |
| FIRST BIT | o1, 0 | o1, 1 | o1, 2 | o1, 3 | o1, 4 | o1, 5 |
| SECOND BIT | o2, 0 | o2, 1 | o2, 2 | o2, 3 | o2, 4 | o2, 5 |
| THIRD BIT | o3, 0 | o3, 1 | o3, 2 | o3, 3 | o3, 4 | o3, 5 |
| FOURTH BIT | o4, 0 | o4, 1 | o4, 2 | o4, 3 | o4, 4 | o4, 5 |
| FIFTH BIT | o5, 0 | o5, 1 | o5, 2 | o5, 3 | o5, 4 | o5, 5 |

WORD DIRECTION →

BIT DIRECTION →

| | | | | | | | |
|---|---|---|---|---|---|---|---|
| INPUT INTO INTERLEAVER 15 (OUTPUT FROM RAM 14) | o0,0 | o0,1 | o0,2 | o0,3 | o0,4 | o0,5 | |
| | o1,0 | o1,1 | o1,2 | o1,3 | o1,4 | o1,5 | |

| | | | | | | | |
|---|---|---|---|---|---|---|---|
| OUTPUT FROM INTERLEAVER 15 (INPUT INTO ACCUMULATOR 16) | o0,0 | o0,2 | o0,4 | o1,0 | o1,2 | o1,4 | |
| | o0,1 | o0,3 | o0,5 | o1,1 | o1,3 | o1,5 | |

ND CODING METHOD
CODING DEVICE AND CODING METHOD FOR A DVB-LIKE LDPC CODE AND A LDPC CODE IN AN ETRI FORMAT

CROSS REFERENCE TO RELATED APPLICATIONS

This application is a U.S. National Phase of International Patent Application No. PCT/JP2016/063619 filed on May 6, 2016, which claims priority benefit of Japanese Patent Application No. JP 2015-101572 filed in the Japan Patent Office on May 19, 2015. Each of the above-referenced applications is hereby incorporated herein by reference in its entirety.

TECHNICAL FIELD

The present technology relates to a coding device and a coding method, and specifically relates to a coding device and a coding method that make it possible to correspond to a DVB-Like LDPC code and an LDPC code in an ETRI format.

BACKGROUND ART

A low density parity check (LDPC) code has high error correction capability and is recently employed widely, for example, in a transmission system of digital broadcasting such as digital video broadcasting (DVB)-S.2 in Europe or the like (see, for example, Non-Patent Document 1).

Also, an LDPC code in which a parity bit of an LDPC code compliant with DVB-S.2 described above is interleaved to a position of a different parity bit (hereinafter, referred to as DVB-Like LDPC code) is employed as a transmission system of digital broadcasting such as DVB-T.2 or DVB-C.2 (see, for example, Non-Patent Document 2).

CITATION LIST

Non-Patent Document

Non-Patent Document 1: DVB-S.2: ETSI EN 302 307 V1.2.1 (2009-08)
Non-Patent Document 2: DVB-T2: ETSI EN 302 755 V1.3.1 (2012-04)

SUMMARY OF THE INVENTION

Problems to be Solved by the Invention

Incidentally, in a standard of digital broadcasting which standard is called the advanced television systems committee (ATSC) 3.0, a DVB-Like LDPC code, and an LDPC code in a format proposed by the Communications Research Centre in Canada and the Electronics and Telecommunications Research Institute in Korea (hereinafter, described as CRC/ETRI) (hereinafter, referred to as LDPC code in ETRI format) are to be employed. Thus, a coding device corresponding to both formats is demanded.

The present technology is provided in view of such a situation and is to make it possible to correspond to both of a DVB-Like LDPC code and an LDPC code in an ETRI format.

Solutions to Problems

A coding device of an aspect of the present technology includes: a first LDPC coding unit configured to generate an LDPC code of a predetermined information word by using a first parity check matrix; a first parity interleaving unit configured to interleave a parity bit of the LDPC code; and a second LDPC coding unit configured to generate an LDPC code in an ETRI format by using a second parity check matrix, which includes the first parity check matrix as a part, with respect to the LDPC code in which the parity bit is interleaved.

A coding method of an aspect of the present technology includes: a first LDPC coding step of generating an LDPC code of a predetermined information word by using a first parity check matrix; a parity interleaving step of interleaving a parity bit of the LDPC code; and a second LDPC coding step of generating an LDPC code in an ETRI format by using a second parity check matrix, which includes the first parity check matrix as a part, with respect to the LDPC code in which the parity bit is interleaved. It is switched after execution of the first LDPC coding step and the parity interleaving step whether to perform an output directly or to perform an output after execution of the second LDPC coding step.

In an aspect of the present technology, an LDPC code of a predetermined information word is generated by utilization of a first parity check matrix, and a parity bit of the LDPC code is interleaved. Also, an LDPC code in an ETRI format is generated by utilization of a second parity check matrix, which includes the first parity check matrix as a part, with respect to the LDPC code in which the parity bit is interleaved.

The coding device may be an independent device or an inner block included in one device.

Effects of the Invention

According to an aspect of the present technology, it is possible to correspond to a DVB-Like LDPC code and an LDPC code in an ETRI format.

Note that effects described herein are not the limitation and may be any of the effects described in the present disclosure.

BRIEF DESCRIPTION OF DRAWINGS

FIG. 1 is a view for describing a parity check matrix H of an LDPC code.
FIG. 2 is a view illustrating a parity check matrix H in which a parity part is a lower triangular matrix.
FIG. 3 is a view illustrating a parity check matrix H in which a parity part is a lower triangular matrix.
FIG. 4 is a view illustrating an example of a parity check matrix H used for LDPC coding.
FIG. 5 is a view illustrating a parity check matrix H' after row permutation or column permutation of the parity check matrix H in FIG. 4.
FIG. 6 is a view illustrating a parity check matrix H' after row permutation or column permutation of the parity check matrix H in FIG. 4.

FIG. 11 is a view for describing the sum stored in the RAM in FIG. 8.

FIG. 13 is a timing chart for describing an input/output of data in the interleaver in FIG. 12.

FIG. 15 is a view for describing an operation of a parity bit p which operation is performed in the accumulator in FIG. 14.

FIG. 16 is a view for describing an operation of a parity bit p which operation is performed in the accumulator in FIG. 14.

MODE FOR CARRYING OUT THE INVENTION

In the following, a mode for carrying out the present technology (hereinafter, referred to as embodiment) will be described. Note that the description will be made in the following order.

1. Description of LDPC code
2. Description of DVB-Like LDPC code
3. Description of LDPC code in ETRI format
4. First embodiment (basic configuration example)
5. Second embodiment (first configuration example in which predetermined block is commonalized)
6. Third embodiment (second configuration example in which predetermined block is commonalized)

<Outline>

In a standard of digital broadcasting which standard is called the advanced television systems committee (ATSC) 3.0, an LDPC code in which a parity bit of an LDPC code compliant with DVB-S.2 or the like is interleaved to a position of a different parity bit (hereinafter, referred to as DVB-Like LDPC code), and an LDPC code in a format proposed by CRC/ETRI (hereinafter, referred to as LDPC code in ETRI format) are to be employed. Thus, a coding device corresponding to both formats is demanded.

Figure 22:
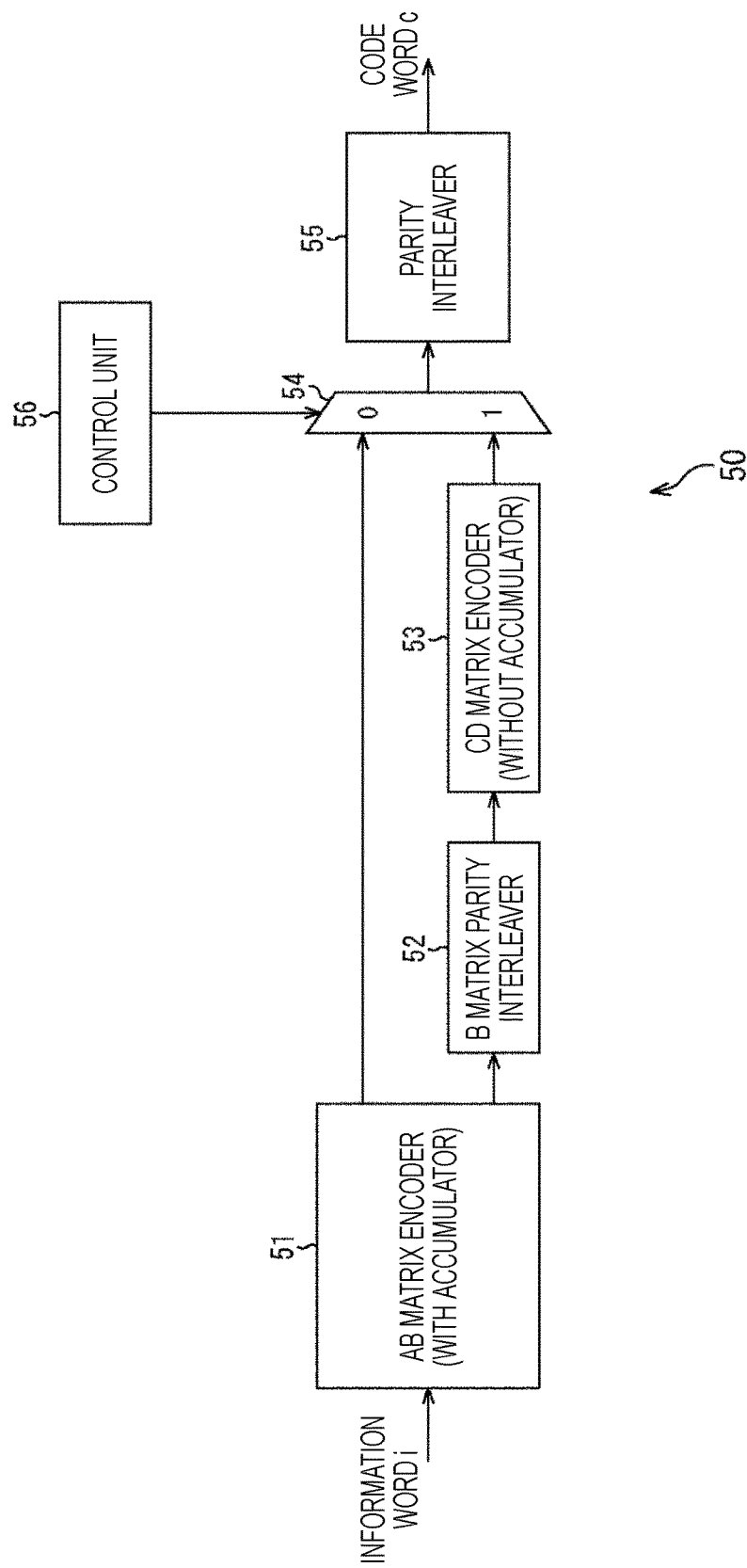
FIG. 22 is a block diagram illustrating a configuration example of a first embodiment of a coding device employing the present technology.

In FIG. 22 or the like described later, a coding device corresponding to formats of both of a DVB-Like LDPC code and an LDPC code in the ETRI format will be proposed. Before this, each of the LDPC code, the DVB-Like LDPC code, and the LDPC code in the ETRI format will be described.

1. Description of LDPC Code

First, an LDPC code employed in digital video broadcasting (DVB)-S.2 or the like is described.

Note that an LDPC code is a linear code and not necessarily binary, but is assumed to be binary here in the description.

Figures 1, 2:
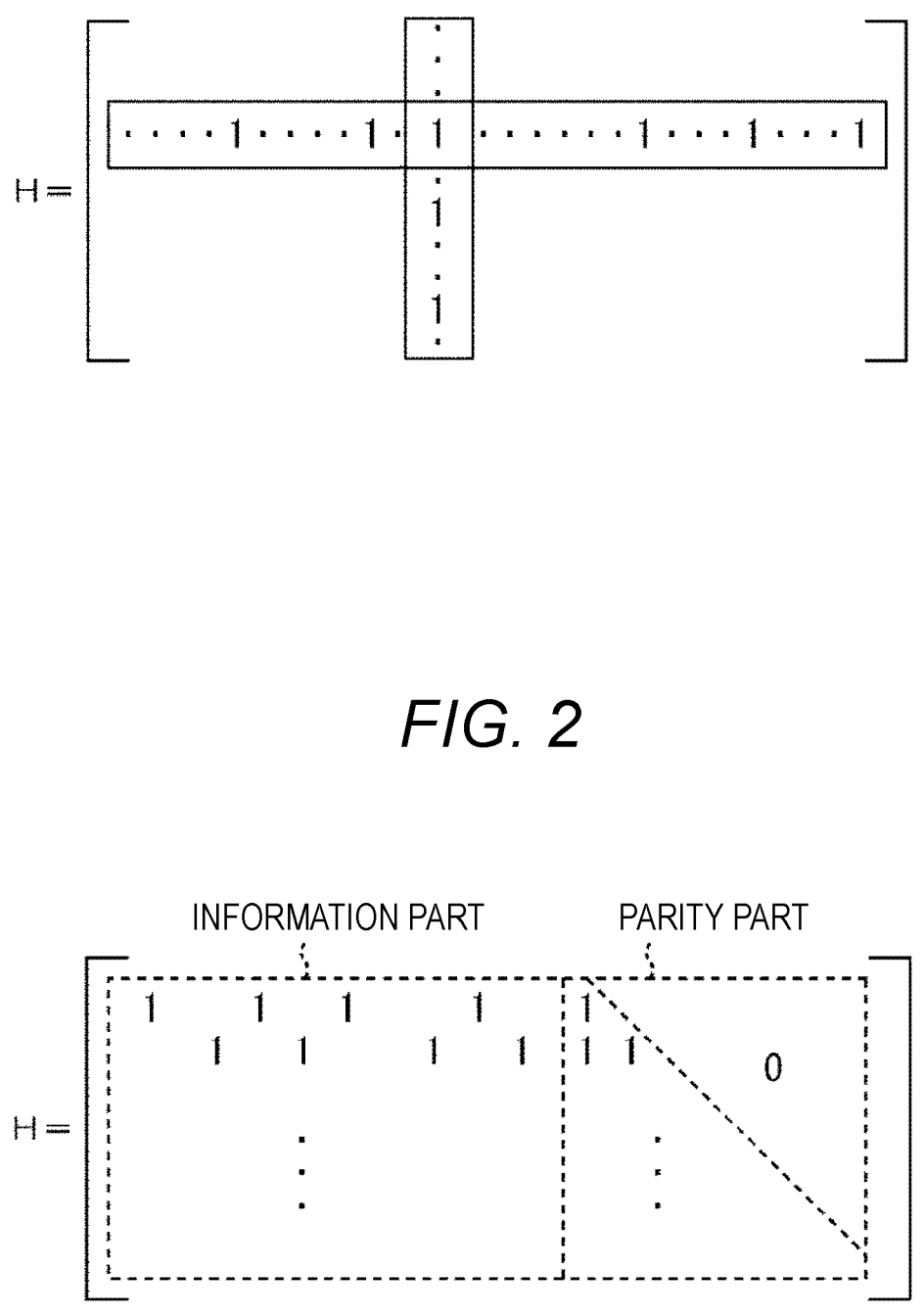

The biggest characteristic of an LDPC code is that a parity check matrix that defines the LDPC code is sparse. Here, a sparse matrix is what includes the very few number of "1" in components of the matrix. In a case where a sparse parity check matrix is expressed with H, such a parity check matrix H includes, for example, one with hamming weight (the number of "1") in each column being "3" and hamming weight in each row being "6" as illustrated in FIG. 1.

In such a manner, an LDPC code defined by a parity check matrix H in which hamming weight in each row and each column is constant is referred to as a regular LDPC code. On the other hand, an LDPC code defined by a parity check matrix H in which hamming weight in each row and each column is not constant is referred to as an irregular LDPC code.

A generator matrix G is generated on the basis of a parity check matrix H and a code word is generated by multiplication of a binary information word i by this generator matrix G, whereby coding into such an LDPC code is realized. More specifically, a coding device to perform coding into an LDPC code first calculates a generator matrix G between which and a transposed matrix HT of the parity check matrix H an equation GHT=0 is established. Here, in a case where a generator matrix G is a k×n matrix (matrix with k rows and n columns), a parity check matrix H is a matrix with (n−k) rows and n columns.

Note that, for example, in a case where an n-bit code word c is a systematic code corresponding to a bit sequence in which a parity bit p having (n−k) bits is arranged in a manner subsequent to a k-bit information word i and in a case where a part with (n−k) rows and k columns which part corresponds to the k-bit information word i in the n-bit code word c is called an information part and a part with (n−k) rows and (n−k) columns which part corresponds to the parity bit p having (n−k) bits is called a parity part in a parity check matrix H with (n−k) rows and n columns, coding of the information word i into an LDPC code can be performed by utilization of the parity check matrix H in a case where the parity part is a lower triangular matrix or an upper triangular matrix.

That is, for example, as illustrated in FIG. 2, in a case where a parity check matrix H includes an information part and a parity part of a lower triangular matrix and all elements in a lower triangular part of the parity part are 1, the zeroth bit of the parity bit p of the code word c is a value acquired by operation of the exclusive OR (EXOR) of a bit, which corresponds to an element that is 1 in the zeroth row of the information part of the parity check matrix H, in the information word i.

Also, the first bit of the parity bit p of the code word c is a value acquired by an operation of EXOR of a bit, which corresponds to an element that is 1 in the first row of the information part of the parity check matrix H, and the zeroth bit of the parity bit p in the information word i.

Moreover, the second bit of the parity bit p of the code word c is a value acquired by an operation of EXOR of a bit, which corresponds to an element that is 1 in the second row of the information part of the parity check matrix H, and the zeroth and first bits of the parity bit p in the information word i.

Similarly, the mth bit of the parity bit p of the code word c is a value acquired by an operation of EXOR of a bit, which corresponds to an element that is 1 in the mth row of the information part of the parity check matrix H, and the zeroth to (m−1)st bits of the parity bit p in the information word i.

In the above manner, it is possible to acquire an n-bit code word c by calculating a parity bit p of (n−k) bits and arranging this parity bit p in a manner subsequent to a k-bit information word i.

That is, in a case where a parity check matrix H with a parity part being a lower triangular matrix is generalized as illustrated in FIG. 3, coding of an information word i into an LDPC code is performed by utilization of the parity check matrix H in the following manner.

In FIG. 3, components in the zeroth row (top row) of the parity check matrix H are $h_{0,0}$, $h_{0,1}$, ... and $h_{0,k-1}$ in an information part and are 1, 0, ... and 0 in a parity part serially from the zeroth column (left end column). Also, components in the first row are $h_{1,0}$, $h_{1,1}$, ... and $h_{1,k-1}$ in the information part and are $h_{1,k}$, 1, 0, ... and 0 in the parity part serially from the zeroth column. Similarly, components in the (n−k−1)st row (bottom row) are $h_{n-k-1,1}$, $h_{n-k-1,1}$, ... and $h_{n-k-1,k-1}$ in the information part and are $h_{n-k-1,k}$, ... $h_{n-k-1,n-2}$, and 1 in the parity part serially from the zeroth column.

Here, it is assumed that k-bit information words i are expressed as $i_0$, $i_1$, ... and $i_{k-1}$ and parity bits p of (n−k) bits are expressed as $p_0$, $p_1$, ... and $p_{n-k-1}$. That is, code words c are expressed with $i_0$, $i_1$, ... $i_{k-1}$, $p_0$, $p_1$, ... and $p_{n-k-1}$. Since the exclusive OR of the product of a code word c and each row of a parity check matrix H is 0, an operation of the product of the code word c and the zeroth row of the parity check matrix H is expressed by the following equation (1).

[Mathematical Formula 1]

$$h_{0,0}i_0 + h_{0,1}i_1 + \ldots + h_{0,k-1}i_{k-1} + p_0 = 0 \pmod 2 \quad (1)$$

Thus, a parity bit $p_0$ is expressed by the following equation (2).

[Mathematical Formula 2]

$$p_0 = \sum_{j=0}^{k-1} h_{0,j} i_j \pmod 2 \quad (2)$$

Also, an operation of the product of the code word c and the first row of the parity check matrix H is expressed by the following equation (3).

[Mathematical Formula 3]

$$h_{1,0}i_0 + h_{1,1}i_1 + \ldots + h_{1,k-1}i_{k-1} + h_{1,k}p_0 + p_1 = 0 \pmod 2 \quad (3)$$

Thus, a parity bit $p_1$ is expressed by the following equation (4).

[Mathematical Formula 4]

$$p_1 = \sum_{j=0}^{k-1} h_{1,j} i_j + h_{1,k} p_0 \pmod 2 \quad (4)$$

Similarly, an operation of the product of the code word c and the (n−k−1)st row of the parity check matrix H is expressed by the following equation (5).

[Mathematical Formula 5]

$$h_{n-k-1,0}i_0 + h_{n-k-1,1}i_1 + \ldots + h_{n-k-1,k-1}i_{k-1} + h_{n-k-1,k}p_0 + h_{n-k-1,k+1}p_1 + \ldots + h_{n-k-1,n-2}p_{n-k-2} + p_{n-k-1} = 0 \pmod 2 \quad (5)$$

Thus, a parity bit $p_{n-k-1}$ is expressed by the following equation (6).

[Mathematical Formula 6]

$$p_{n-k-1} = \sum_{j=0}^{k-1} h_{n-k-1,j} i_j + \sum_{j=0}^{n-k-2} h_{n-k-1,k+j} p_j \pmod 2 \quad (6)$$

In the above manner, it is possible to acquire the n-bit code word c by calculating the parity bits $p_0$, $p_1$, ... and $p_{n-k-1}$ of (n−k) bits and arranging these parity bits in a manner subsequent to $i_0$, $i_1$, ... and $i_{k-1}$ that are the k-bit information words i.

Note that in an information word i and a code word c of an LDPC code, one bit can be expressed as $\{0, \ldots q\}(q \geq 1)$ and is not necessarily binary. However, in the following, a description will be made on the assumption that one bit is binary.

Figure 4:
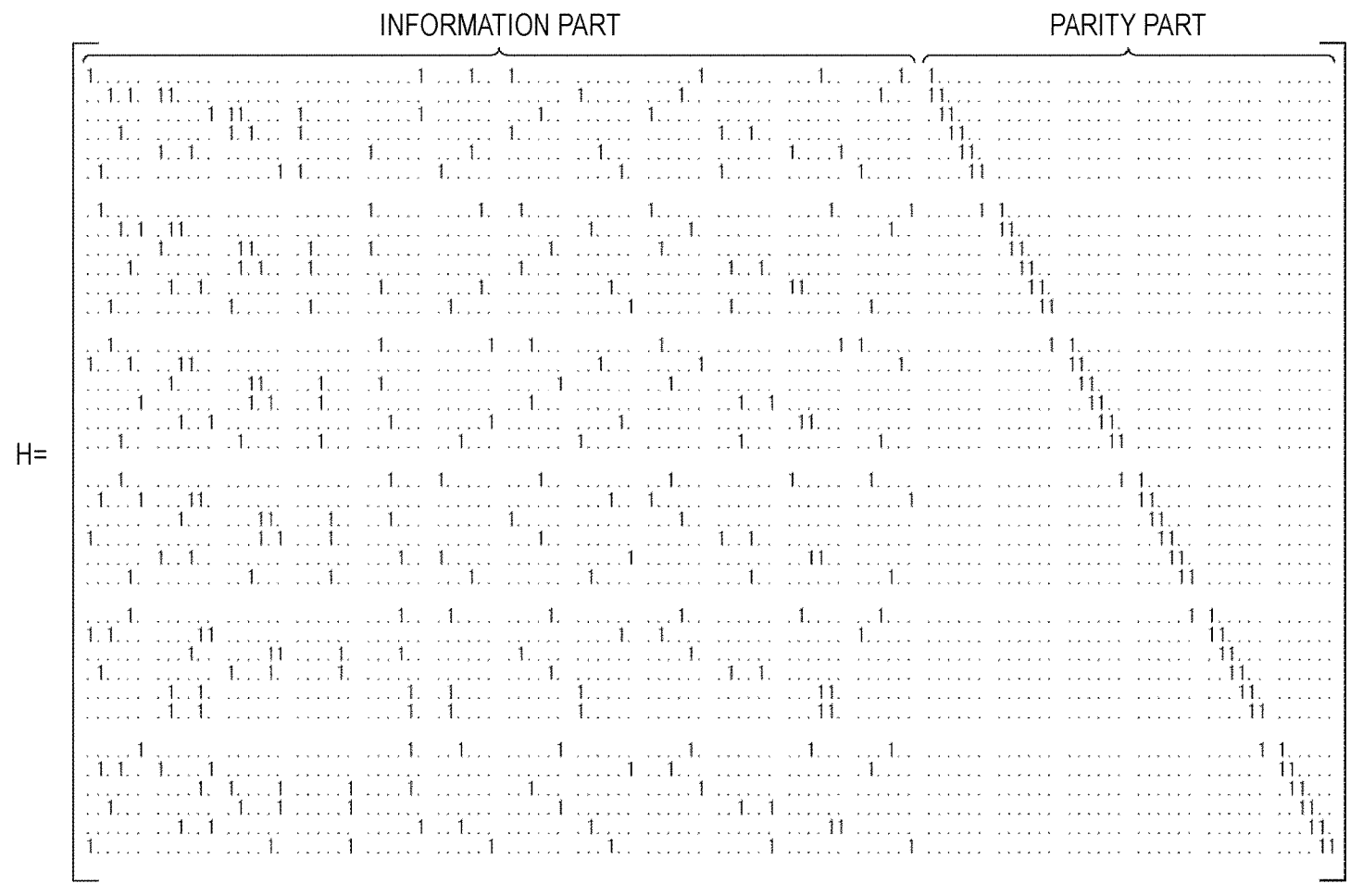

FIG. 4 is a view illustrating an example of a parity check matrix H used for LDPC coding.

The parity check matrix H in FIG. 4 is a parity check matrix H to acquire a code word c with n=108 and k=72 (code rate being 2/3 and code length being 108) and is a 36 (row)×108 (column) matrix. Note that 0 is expressed as "." in the parity check matrix H in FIG. 4 (also in matrix in FIG. 5, FIG. 6, FIGS. 7A and 7B, FIG. 22, and FIG. 25 described later). Also, the parity check matrix H in FIG. 4 is expressed with a space in a unit of a 6×6 matrix.

That is, the parity check matrix H includes an information part with 36 (=n−k) rows and 72(=k) columns and a parity part with 36 (=n−k) rows and 36 (=n−k) columns. In coding into an LDPC code, the information part is multiplied by an information word i of a code word c of an LDPC code, and the parity part is multiplied by a parity bit p of the code word c.

In the parity check matrix H in FIG. 4, each row of an information part corresponding to an information word i of an LDPC code includes seven "1" and 101 "0." A parity part is a matrix having a lower triangular structure (lower triangular matrix). That is, the parity part of the parity check matrix H in FIG. 4 is a matrix, all in the upper right of a diagonal line of the matrix being "0," and has a lower triangular structure.

Figure 5:
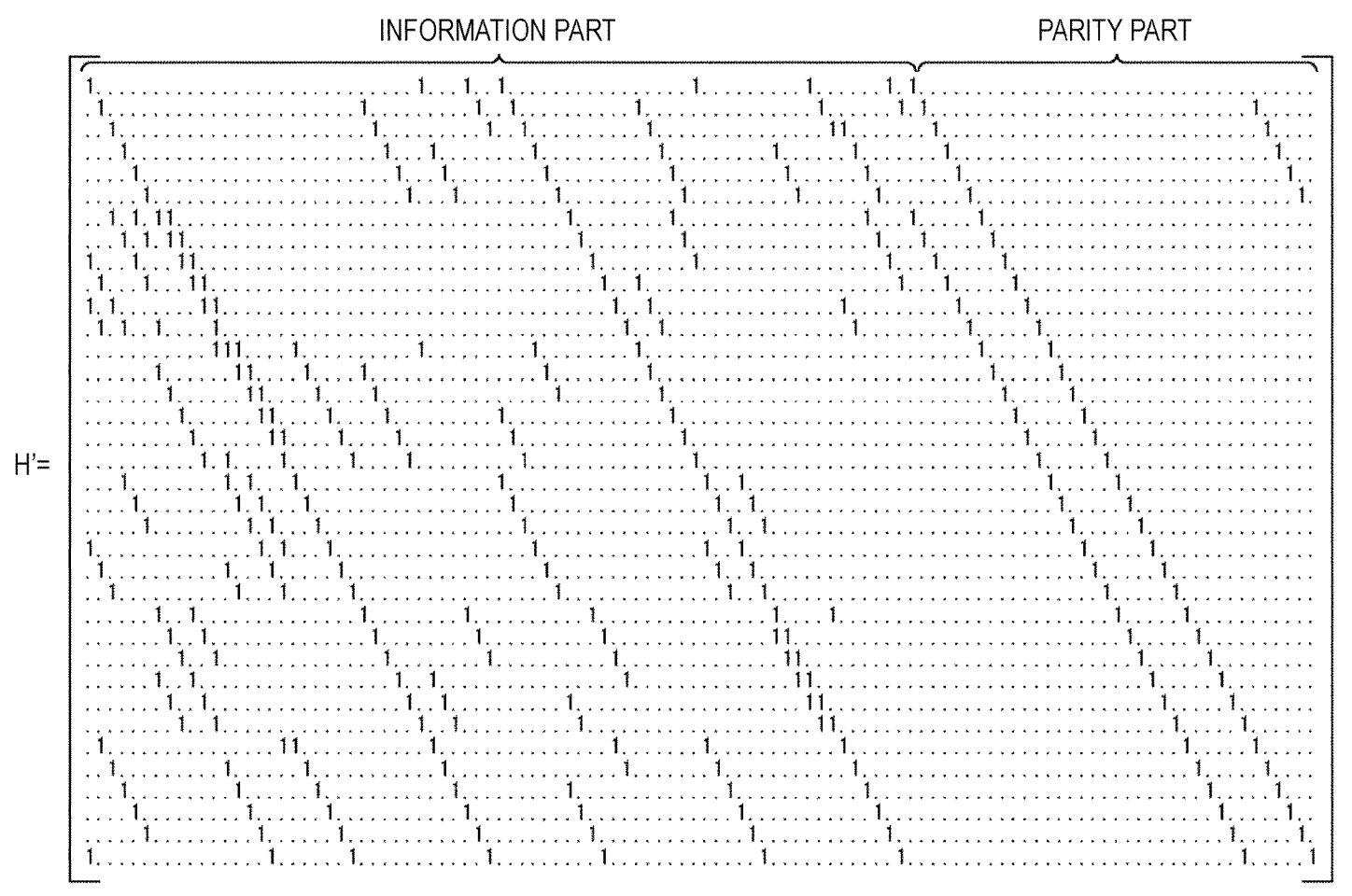
Figure 6:
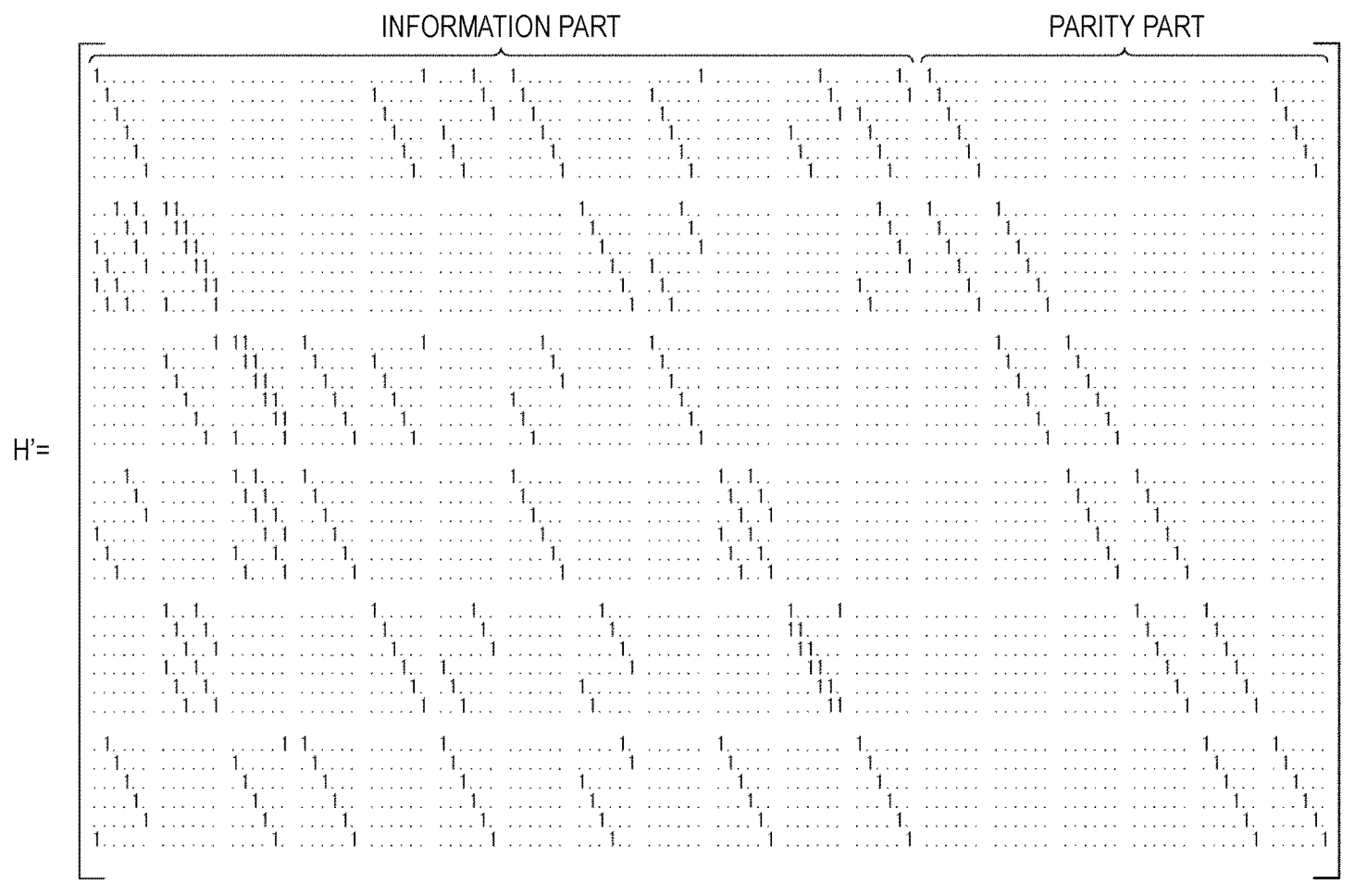

FIG. 5 and FIG. 6 are views illustrating a parity check matrix H' after row permutation or column permutation of the parity check matrix H in FIG. 4.

In a parity check matrix H' in FIG. 5, an information part can be expressed by a combination of a P×P identity matrix (P=6 in case of example of FIG. 5), a matrix in which one or more of 1 in the identity matrix become 0 (hereinafter, arbitrarily referred to as quasi-identity matrix), a matrix in which an identity matrix or a quasi-identity matrix is cyclic-shifted (hereinafter, arbitrarily referred to as shift matrix), the sum of two or more of an identity matrix, a quasi-identity matrix, and a shift matrix (hereinafter, arbitrarily referred to as sum matrix), and a P×P zero matrix. Note that in the following, a P×P identity matrix, quasi-identity matrix, shift matrix, sum matrix, and zero matrix are arbitrarily referred to as constitutive matrices.

A parity check matrix H in FIG. 6 is a parity check matrix H in FIG. 5 being expressed with a space in a unit of a 6×6 constitutive matrix. In a case where the number of constitutive matrices in a horizontal direction which matrices are included in the parity check matrix H is $n_0$, and the number of constitutive matrices in a horizontal direction which matrices are included in an information part of the parity check matrix H is $k_0$, $n_0$ (=n/P=108/6) is 18 and $k_0$ (=k/P=72/6) is 12.

That is, in the parity check matrix H in FIG. 5 or FIG. 6, six (=$n_0$−$k_0$=18−12) constitutive matrices are lined up in the vertical direction and $n_0$ (=18) constitutive matrices are lined up in the horizontal direction.

Also, in a case where a top row (head row) of the parity check matrix H in FIG. 4 is the zeroth row, the {($n_0$−$k_0$)×v+w}th row (0≤v≤P−1, 0≤w≤$n_0$−$k_0$−1) of the parity check matrix H is the (P×w+v)th row in the parity check matrix H' in FIG. 5 or FIG. 6.

LDPC coding is performed by utilization of the parity check matrix H' in FIG. 5 or FIG. 6, whereby integration of each row of an information part of the parity check matrix H' and an information word i which integration is an operation necessary for the LDPC coding can be performed by cyclic shift of information words i in a unit of six. That is, since the number of "1" in each row of a P×P identity matrix, quasi-identity matrix, or shift matrix that is a constitutive matrix, or a P×P identity matrix, quasi-identity matrix, or shift matrix in a case where a sum matrix of constitutive matrices is divided into a plurality of matrices is one, it is possible to calculate the product of each row of an information part of the parity check matrix H' and an information word i by cyclic shift of six information words i corresponding to the constitutive matrix.

Figure 7B:
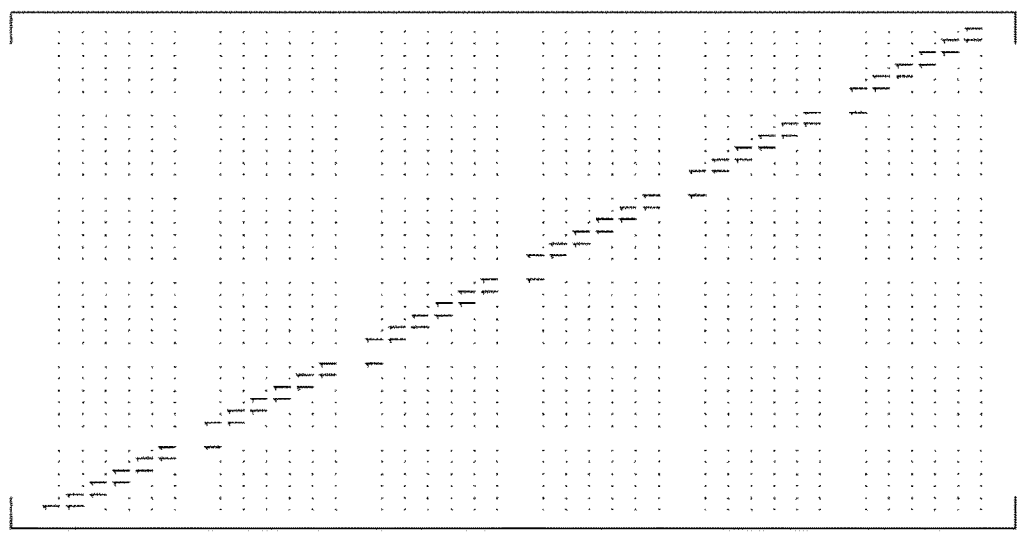
FIGS. 7A and 7B are views illustrating parity parts of the parity check matrix H in FIG. 4 and the parity check matrix H' in FIG. 5 or FIG. 6.
Figure 7A:
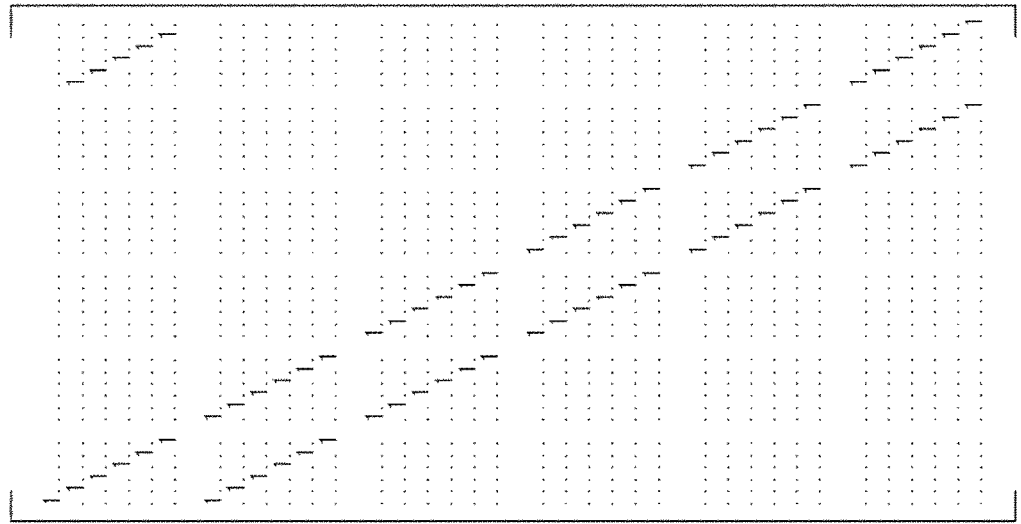

In FIG. 7A and FIG. 7B, parity parts of the parity check matrix H in FIG. 4 and the parity check matrix H' in FIG. 5 or FIG. 6 are illustrated.

As illustrated in FIG. 7A, the parity part of the parity check matrix H in FIG. 4 is a matrix, all in the upper right of a diagonal line of the matrix being "0," and has a lower triangular structure. Also, in a parity part, a diagonal component of the lower triangular matrix and a component just below the component are 1 and the other components are 0. With this arrangement, it is possible to easily perform an operation of calculating a parity bit p in LDPC coding.

As illustrated in FIG. 7B, the {($n_0$−$k_0$)×v+w}th row of a parity part in FIG. 7A is the (P×w+v)th row in the parity part of the parity check matrix H' in FIG. 5 or FIG. 6.

Figure 8:
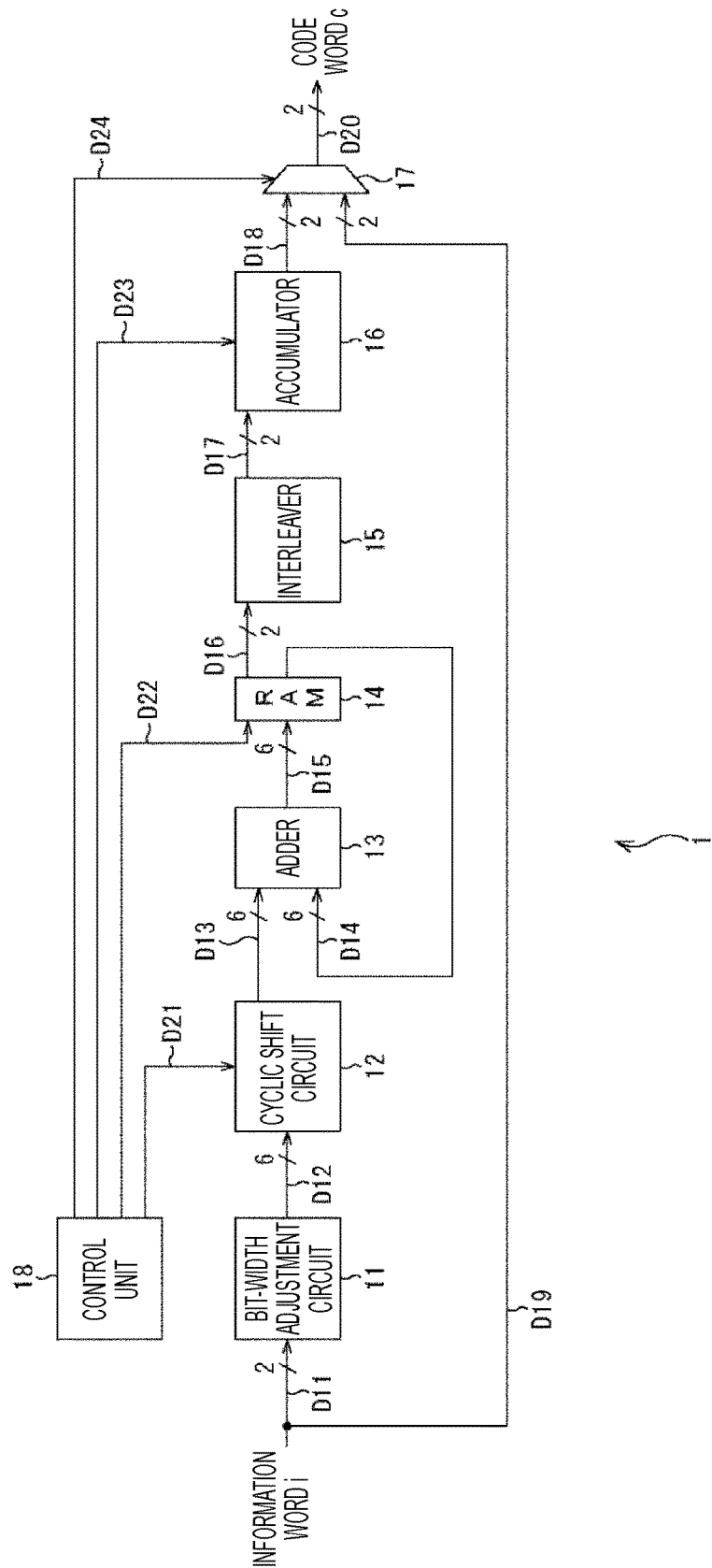
FIG. 8 is a block diagram illustrating a configuration example of a coding device that generates an LDPC code.

FIG. 8 is a block diagram illustrating a configuration example of a coding device 1 to generate the LDPC code described above.

The coding device 1 in FIG. 8 performs LDPC coding of an information word i by using the parity check matrix H in FIG. 4 and outputs an accordingly-acquired code word c.

The coding device 1 includes a bit-width adjustment circuit 11, a cyclic shift circuit 12, an adder 13, a RAM 14, an interleaver 15, an accumulator 16, a selector 17, and a control unit 18.

Information words D11 (information word i) are supplied in a unit of two bits to the bit-width adjustment circuit 11. By the bit-width adjustment circuit 11, three information words D11 supplied in a unit of two bits are combined and supplied as an information word D12 in a unit of six bits to the cyclic shift circuit 12.

A control signal D21, which indicates information indicating how many times an original identity matrix or the like in the parity check matrix H' is cyclic-shifted to acquire 1 in an information part of the parity check matrix H' which part corresponds to the information word D12, is supplied to the cyclic shift circuit 12 by the control unit 18. The cyclic shift circuit 12 calculates the product (h×i) of a value h in each row of a constitutive matrix, which is not a zero matrix among constitutive matrices included in the parity check matrix H', and an information word D12 by performing cyclic shift of 12 (=$k_0$) 6-bit information words D12, which are serially supplied by the bit-width adjustment circuit 11, on the basis of the control signal D21 and serially supplies (outputs) the product to the adder 13.

Note that in a case where a constitutive matrix is a sum matrix, that is, in a case where hamming weight of the constitutive matrix is two or larger, the cyclic shift circuit 12 calculates the product of a matrix and an information word D12 in a unit of a matrix of a case where the sum matrix is divided into the sum of a plurality of matrices among an identity matrix, a quasi-identity matrix, and a shift matrix, and supplies a value acquired by an EXOR operation (addition) thereof in each corresponding row to the adder 13 as an information word D13. Also, the cyclic shift circuit 12 performs cyclic shift of the information word D12 in a unit of six bits but may perform cyclic shift in a unit of bits of a divisor of 6 (=P).

The adder 13 includes six adders (not illustrated). Each adder integrates the product D13 in each row in a unit of six rows by calculating, for each bit, EXOR of the 6-bit product D13 from the cyclic shift circuit 12 and the 6-bit sum D14 from the RAM 14 and by supplying an accordingly-acquired 6-bit value to the RAM 14 as the sum D15 (first integration value).

A control signal D22 designating an address at which reading or writing of data is performed is supplied by the control unit 18 to the RAM 14. On the basis of the control signal D22, the RAM 14 stores the sum D15 from the adder 13 in a unit of six bits or reads the already-stored sum D15 in a unit of six bits or two bits.

In such a manner, since being able to simultaneously store or read the 6-bit or 2-bit sum D15, the RAM 14 can perform processing in LDPC coding in a unit of six bits or two bits. As a result, it is possible to perform the LDPC coding with a moderate circuit size and operation frequency in the coding device 1.

The RAM 14 supplies the sum D15 read in a unit of six bits to the adder 13 as the sum D14 or supplies the sum D15 read in a unit of two bits to the interleaver 15 as the sum D16. Note that a bit length of the RAM 14 is six (=P) and a word length thereof is six (=$n_0$−$k_0$).

The interleaver 15 controls order of the sum D16 supplied by the RAM 14. More specifically, the interleaver 15 sorts the sum D16 into order corresponding to the parity check matrix H, and supplies the sorted sum D17 to the accumulator 16.

A selection signal D23 indicating selection in a selector 62 of the accumulator 16 (in FIG. 14 described later) is supplied by the control unit 18 to the accumulator 16. On the basis of the selection signal D23 and the sum D17 serially supplied by the interleaver 15, the accumulator 16 performs a predetermined operation (such as equation (2), (4), and (6)) and serially supplies (outputs) accordingly-acquired parity bits p to the selector 17 as parity bits D18 in a unit of two bits. That is, the accumulator 16 integrates the sum D17 and supplies accordingly-acquired parity bits p to the selector 17 as parity bits D18 (second integration value) in a unit of two bits.

An information word i delayed for a predetermined period is supplied as an information word D19 in a unit of two bits to the selector 17. On the basis of a selection signal D24 indicting selection of one of the parity bit D18 and the information word D19 which signal is from the control unit 18, the selector 17 selects one of the parity bit D18 and the information word D19 from the accumulator 16 and performs an output thereof in a unit of two bits as a code word D20 (code word c). More specifically, the selector 17 outputs a code word D20 by outputting a k-bit information word D19 in a unit of two bits and outputting the following parity bits D18 having (n−k) bits in a unit of two bits.

The control unit 18 supplies a control signal D21 to the cyclic shift circuit 12, a control signal D22 to the RAM 14, a selection signal D23 to the accumulator 16, and a selection signal D24 to the selector 17.

The number of times of cyclic shift performed by the cyclic shift circuit 12 in FIG. 8 will be described with reference to FIG. 9.

Note that an information word D12 in (6×s)th to {6×(s+1)−1}st bits (s=0, 1, 2, . . . and $k_0$−1) of an information word i supplied by the bit-width adjustment circuit 11 will be called an sth vector in the following.

Figures 9, 10:
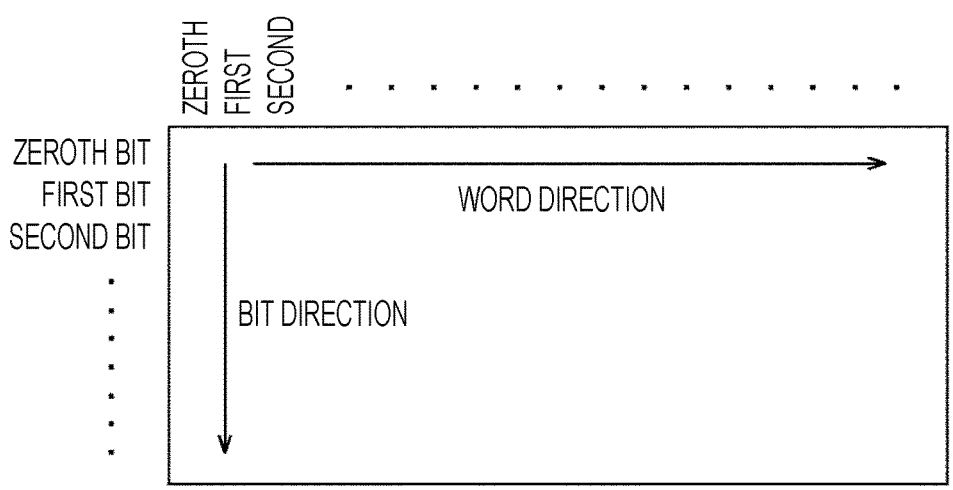
FIG. 9 is a chart for describing the number of times of cyclic shift performed by a cyclic shift circuit in FIG. 8.
FIG. 10 is a view for describing the sum stored in a RAM in FIG. 8.

In FIG. 9, a number in a top row indicates a number of a vector, and a number at a left end indicates a number of a constitutive matrix of the parity check matrix H' from the top. Note that it is assumed that a number of a constitutive matrix from the top is assigned serially from 0. Also, in FIG. 9, "−" indicates that the cyclic shift circuit 12 does not output an information word D13.

For example, in a case where the mth row and the lth column are expressed as (m, l), a constitutive matrix in (0, 0) to (5, 5) of the parity check matrix H' is an identity matrix, a constitutive matrix in (6, 0) to (11, 5) is a sum matrix (sum matrix that is the sum of a first shift matrix that is a 6×6 identity matrix cyclic-shifted twice in a right direction and a second shift matrix that is a 6×6 identity matrix cyclic-shifted four times in the right direction), a constitutive matrix in (12, 0) to (17, 5) is a zero matrix, a constitutive matrix in (18, 0) to (23, 5) is a shift matrix (shift matrix that is 6×6 identity matrix cyclic-shifted for three in right direction), a constitutive matrix in (24, 0) to (29, 5) is a zero matrix, and a constitutive matrix in (30, 0) to (35, 5) is a shift matrix (shift matrix that is a 6×6 identity matrix cyclic-shifted five times in the right direction) as illustrated in FIG. 6.

Thus, according to the constitutive matrix included in the zeroth to fifth row from the left in the parity check matrix H', the cyclic shift circuit 12 does not perform cyclic shift and outputs the zeroth vector as it is as the product D13 of the zeroth vector and the constitutive matrix in (0, 0) to (5, 5) of the parity check matrix H' at the beginning. That is, as illustrated in FIG. 9, in a case where the product of the zeroth vector and the zeroth constitutive matrix from the top in the parity check matrix H' is calculated, the number of times of cyclic shift by the cyclic shift circuit 12 is zero.

Next, the cyclic shift circuit 12 calculates the product of the zeroth vector and the constitutive matrix in (6, 0) to (11, 5) by performing cyclic shift of the zeroth vector twice in the right direction, performing cyclic shift of the zeroth vector four times in the right direction, and performing an EXOR operation of accordingly-acquired two 6-bit information words D12 after the cyclic shift. That is, the cyclic shift circuit 12 performs an EXOR operation of an information word D12 acquired for each of the first and second shift matrices in such a manner that the information words D12 acquired for the first shift matrix and the second shift matrix of a case where the constitutive matrix in (6, 0) to (11, 5) is divided into the sum of the first shift matrix and the second shift matrix are stored at the same address of the RAM 14 via the adder 13. Then, the cyclic shift circuit 12 outputs the calculated product as the product D13.

That is, as illustrated in FIG. 9, in a case where the product of the zeroth vector and the first constitutive matrix from the top in the parity check matrix H' is calculated, the number of times of cyclic shift by the cyclic shift circuit 12 is two and four in the right direction.

Here, since the second constitutive matrix from the top in (12, 0) to (17, 5) of the parity check matrix H' is a zero matrix, the cyclic shift circuit 12 does not perform processing with respect to the constitutive matrix and outputs nothing ("−" in FIG. 9).

Similarly, the cyclic shift circuit 12 calculates the product of the zeroth vector and the third constitutive matrix in (18, 0) to (23, 5) of the parity check matrix H' by performing cyclic shift of the zeroth vector three times in the right direction, and calculates the product of the zeroth vector and the constitutive matrix in (30, 0) to (35, 5) by performing cyclic shift of the zeroth vector five times in a left direction. Then, the cyclic shift circuit 12 outputs an information word D12 after the cyclic shift as the product D13.

In the above manner, the cyclic shift circuit 12 calculates the product of the zeroth vector supplied by the bit-width adjustment circuit 11 at the first time and each of the zeroth to fifth (=P−1) columns from the left in the parity check matrix H'.

Similarly, the cyclic shift circuit 12 calculates the product of each of the first to eleventh vectors supplied by the bit-width adjustment circuit 11 at the second time to the twelfth time and each of the sixth to 71st columns from the left in the parity check matrix H'.

Next, the sum D15 stored in the RAM 14 in FIG. 8 will be described with reference to FIG. 10 and FIG. 11.

Note that a word direction of the RAM 14 in the following description is a horizontal direction in the drawing as illustrated in FIG. 10 and is called a zeroth address, a first address, a second address, . . . serially from the left end. Also, a bit direction of the RAM 14 is a vertical direction in the drawing and is called a zeroth bit, a first bit, a second bit, . . . serially from the top.

Also, in the following, the sum D15 of the product of the wth row (=P×v+w=6×v+w) from the top in the vth constitutive matrix from the top in the parity check matrix H' and the zeroth to eleventh vectors is also expressed to as $o_{w,v}$. That is, $o_{w,v}$ is expressed by the following equation (7).

[Mathematical Formula 7]

$$o_{v,w} = \sum_{j=0}^{k-1} h_{6 \times v+w, j} i_j \quad (7)$$

As illustrated in FIG. 11, a bit length of the RAM 14 is P (=6) and a word length thereof is $n_0$–$k_0$ (=6). First, the product of the zeroth vector and the zeroth constitutive matrix from the top in the parity check matrix H' is supplied as the 6-bit sum D15 to the RAM 14 by the cyclic shift circuit 12 via the adder 13. The RAM 14 stores bits of the sum D15 serially from the zeroth bit of the zeroth address.

Subsequently, the product of the first vector and the first constitutive matrix from the top in the parity check matrix H' is supplied as the 6-bit sum D15 to the RAM 14 by the cyclic shift circuit 12 via the adder 13. The RAM 14 stores bits of the sum D15 serially from the zeroth bit of the first address. Similarly, the sum D15 is stored in each of the second to fifth addresses of the RAM 14.

Also, the RAM 14 reads the product of the zeroth vector and the zeroth constitutive matrix from the top in the parity check matrix H', the product being stored in the zeroth to fifth bits of the zeroth address, and supplies the product as the 6-bit sum D14 to the adder 13. Similarly, the 6-bit sum D15 stored in each of the first to fifth addresses of the RAM 14 is read and supplied as the sum D14 to the adder 13.

The adder 13 performs an EXOR operation of the product of the zeroth vector and the zeroth constitutive matrix from the top in the parity check matrix H', the product being supplied as the 6-bit sum D14 by the RAM 14, and the product of the first vector and the zeroth constitutive matrix from the top in the parity check matrix H', the product being supplied by the cyclic shift circuit 12, and supplies the accordingly-acquired sum D15 to the RAM 14. The RAM 14 stores bits of the sum D15 serially from the zeroth bit of the zeroth address. That is, the RAM 14 updates the zeroth address. Similarly, the RAM 14 updates the first to fifth addresses.

Then, similar processing is repeatedly performed and $o_{0,0}$ that is the sum D15 of the product of the zeroth row from the top of the zeroth constitutive matrix from the top in the parity check matrix H' and the zeroth to eleventh vectors is stored in the zeroth bit of the zeroth address of the RAM 14. Also, $o_{1,0}$ to $o_{5,0}$ are respectively stored in the first to fifth bits of the zeroth address of the RAM 14.

Similarly, $o_{0,1}$ to $o_{5,1}$ are respectively stored in the zeroth to fifth bits of the first address of the RAM 14, $o_{0,2}$ to $o_{5,2}$ are respectively stored in the zeroth to fifth bits of the second address, $o_{0,3}$ to $o_{5,3}$ are respectively stored in the zeroth to fifth bits of the third address of the RAM 14, $o_{0,4}$ to $o_{5,4}$ are respectively stored in the zeroth to fifth bits of the fourth address of the RAM 14, and $o_{0,5}$ to $o_{5,5}$ are respectively stored in the zeroth to fifth bits of the fifth address.

As described above, the addresses of the RAM 14 correspond to six rows of the information part of the parity check matrix H. The RAM 14 stores the sum D15 ($o_{0,0}$ to $o_{5,5}$) in such a manner that the number of rows (6×v+w) from the top in the parity check matrix H' which number corresponds to the sum D15 is increased in a lower right direction from the upper left in the drawing. Also, the RAM 14 stores $o_{0,0}$ to $o_{5,5}$ in such a manner that a column direction (horizontal direction) is filled with 1 of the constitutive matrix of the parity check matrix H'.

Here, order in the word direction (horizontal direction) of the sum D15 order of which in the bit direction (vertical direction) is the (P×x+y)th (x=0, 1, . . . and 5, y=0, 1, . . . and 5) is the {($n_0$–$k_0$)×y+x}th. Note that it is assumed that what follows the fifth bit of each number address is the zeroth bit of an address on the right (address of next number) in the order in the bit direction. Also, it is assumed that what follows the fifth address of each bit is the zeroth address of a bit therebelow (next bit) in the order in the word direction. For example, the sixth sum D15 in the order in the bit direction is $o_{0,1}$ and the sixth sum D15 in the order in the word direction is $o_{1,0}$.

As described above, the {($n_0$–$k_0$)×v+w}th row in the parity check matrix H is the (P×w+v)th row in the parity check matrix H' in FIG. 5. That is, the (P×w+v)th row of the parity check matrix H' is the {($n_0$–$k_0$)×v+w}th row of the parity check matrix H. Thus, seen in the order in the word direction, $o_{w,v}$ that is the sum of the product of each row of the information part of the parity check matrix H' and the zeroth to eleventh vectors and that is stored as the sum D15 serially from the zeroth row of the parity check matrix H' in the bit direction of the RAM 14 is $o_{w,v}$ that is the sum of the product corresponding to the parity check matrix H serially from the zeroth row.

However, generally, the RAM 14 cannot simultaneously access two or more addresses. Thus, the sum D15 cannot be read in the word direction. Thus, in the coding device 1, the interleaver 15 sorts the order of the sum D15 read by the RAM 14 in the bit direction. A detail of the interleaver 15 will be described with reference to FIG. 12 and FIG. 13 described later.

Figure 12:
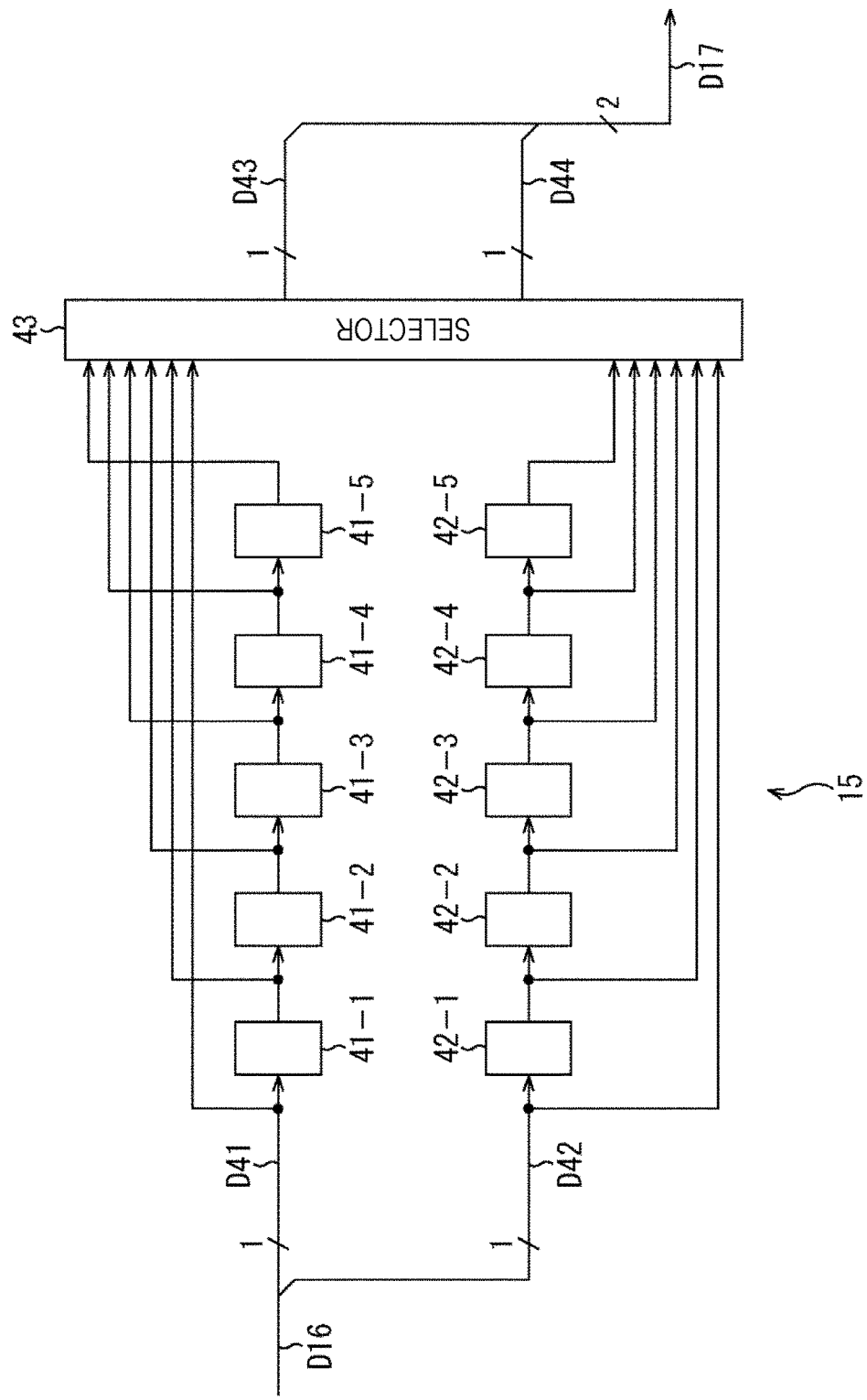
FIG. 12 is a view illustrating a detailed configuration example of an interleaver in FIG. 8.

FIG. 12 is a view illustrating a detailed configuration example of the interleaver 15 in FIG. 8.

Five registers 41-1 to 41-5, five registers 42-1 to 42-5, and a selector 43 perform supplying to the interleaver 15 in FIG. 12.

The 2-bit sum D16 is supplied by the RAM 14 to the interleaver 15 and one bit thereof is stored as the sum D41 into the registers 41-1 to 41-5 serially in a unit of one bit. Also, the other one bit is stored as the sum D42 into the registers 42-1 to 42-5 serially in a unit of one bit. Each of the registers 41-1 to 41-5 and the registers 42-1 to 42-5 supplies the stored 1-bit sum D41 or D42 to the selector 43.

The selector 43 selects any two pieces of the sum D41 or D42 among five pieces of the sum D41 or D42 respectively supplied by the registers 41-1 to 41-5 or the registers 42-1 to 42-5, and outputs the selected sum as the sum D43 and D44. The 1-bit sum D43 and D44 are combined and supplied as the 2-bit sum D17 to the accumulator 16.

In the above manner, in the interleaver 15, the registers 41-1 to 41-5 and the registers 42-1 to 42-5 store the input sum D16 (sum D41 or D42), and the selector 43 selects the sum D16 stored in the registers 41-1 to 41-5 and the registers 42-1 to 42-5 and outputs the selected sum as the sum D17 (sum D43 or D44), whereby the order of the input sum D16 and the output sum D17 is reversed.

Next is a timing chart for describing an input/output of data in the interleaver 15 in FIG. 12 with reference to FIG. 13. In FIG. 13, a horizontal axis indicates time.

As illustrated in FIG. 13, the RAM 14 first reads, as the sum D16, two bits that are $o_{0,0}$ and $o_{1,0}$ stored at the zeroth address and performs an output thereof to the interleaver 15. That is, $o_{0,0}$ and $o_{1,0}$ are input as the sum D16 into the interleaver 15.

Next, the RAM 14 outputs, as the sum D16, two bits that are $o_{0,1}$ and $o_{1,1}$ stored at the first address to the interleaver 15. Similarly, the RAM 14 outputs, as the sum D16, $o_{0,2}$ and $o_{1,2}$, $o_{0,3}$, and $o_{1,3}$, $o_{0,4}$, and $o_{1,4}$, or $o_{0,5}$, and $o_{1,5}$ respectively stored at the second to fifth addresses to the interleaver 15.

For example, $o_{0,0}$ to $o_{0,5}$ each of which is one bit in the sum D16 input into the interleaver 15 are serially supplied to and stored in the registers 41-1 to 41-5 of the interleaver 15 in FIG. 12. Also, $o_{1,0}$ to $o_{5,0}$ each of which is the other one bit are serially supplied to and stored in the registers 42-1 to 42-5. Then, the registers 41-1 to 41-5 and 42-1 to 42-5 respectively supply $o_{0,0}$ to $o_{0,5}$ and $o_{1,0}$ to $o_{5,0}$ to the selector 43.

As illustrated in FIG. 13, first, $o_{0,0}$ and $o_{0,1}$ are selected and respectively output as the sum D43 and D44 by the selector 43. That is, $o_{0,0}$ and $o_{0,1}$ are input as the sum D17 into the accumulator 16. Next, $o_{0,2}$ and $o_{0,3}$ are selected and respectively output as the sum D43 and D44 by the selector 43. Subsequently, the selector 43 selects and outputs $o_{0,4}$ and $o_{0,5}$, $o_{1,0}$ and $o_{1,1}$, $o_{1,2}$ and $o_{1,3}$, and $o_{1,4}$ and $o_{1,5}$ in this order.

That is, in a case where $o_{0,0}$ to $o_{0,5}$ each of which is one bit in the sum D16 input into the interleaver 15 and is stored in the zeroth bit of the RAM 14 are called a sequence #1 and $o_{1,0}$ to $o_{5,0}$ each of which is the other one bit and is stored in the first bit of the RAM 14 are called a sequence #2, the selector 43 selects the sequence #1 serially from $o_{0,0}$ by two bits and then selects the sequence #2 serially from $o_{1,0}$ by two bits. That is, the selector 43 selects the input sum D16 by two bits in the order in the word direction of the RAM 14 in which the sum D16 is stored.

In the above manner, the interleaver 15 selects and outputs the 2-bit sum D16, which is read and input in the order in the bit direction of the RAM 14, by two bits in the order in the word direction of the RAM 14 in which the sum D16 is stored. Thus, it is possible to output $o_{w,v}$, which is the sum of the product of each row of the information part of the parity check matrix H and the zeroth to eleventh vectors, as the sum D17 in a unit of two bits serially from the zeroth row of the information part of the parity check matrix H.

Figure 14:
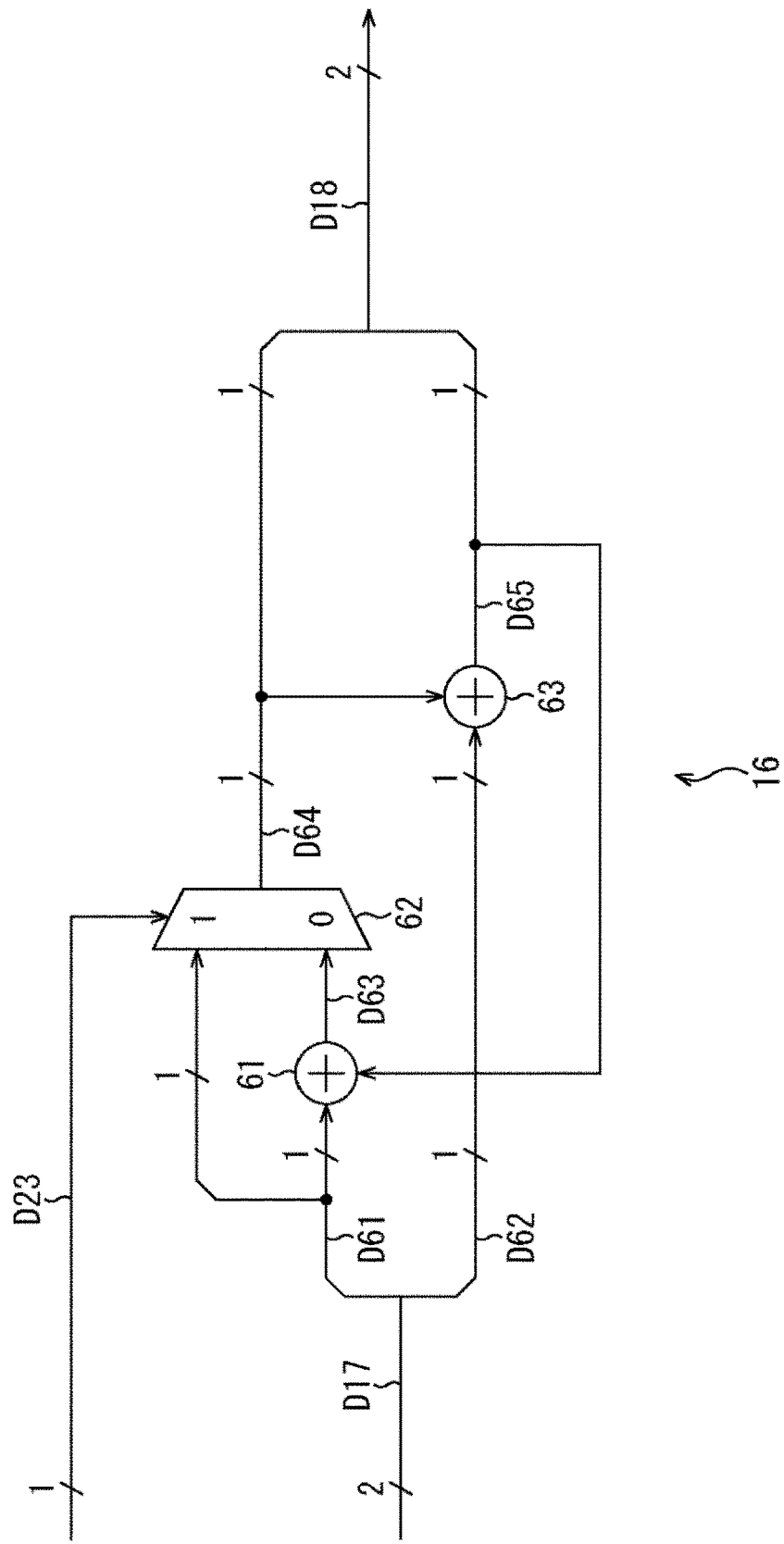
FIG. 14 is a view illustrating a detailed configuration example of an accumulator in FIG. 8.

FIG. 14 is a view illustrating a detailed configuration example of the accumulator 16 in FIG. 8.

The accumulator 16 in FIG. 14 includes adders 61 and 63, and a selector 62.

To the adder 61, the sum D61 that is one bit in the 2-bit sum D17 is supplied by the interleaver 15 and a parity bit D65 acquired from previous addition is supplied by the adder 63. The adder 61 adds the sum D61 and the parity bit D65 and supplies an accordingly-acquired value as the sum D63 to the selector 62.

In addition to the supplying of the sum D61, a selection signal D23 is supplied by the control unit 18 to the selector 62. The selector 62 outputs the sum D61 or D63 as a parity bit D64 to the selector 17 and the adder 63 on the basis of the selection signal D23.

To the adder 63, the sum D62 that is one bit other than the sum D61 in the 2-bit sum D17 is supplied by the interleaver 15. The adder 63 adds the parity bit D64, which is acquired from the previous addition and supplied by the selector 62, and the sum D62 and outputs an accordingly-acquired value as a parity bit D65 to the selector 17 and the adder 61. Note that the parity bits D64 and D65 respectively output from the selector 62 and the adder 63 are combined and supplied as a 2-bit parity bit D18 (parity bit p) to the selector 17.

An operation of the parity bit p which operation is performed in the accumulator 16 in FIG. 14 will be described with reference to FIG. 15 and FIG. 16.

Figure 15:
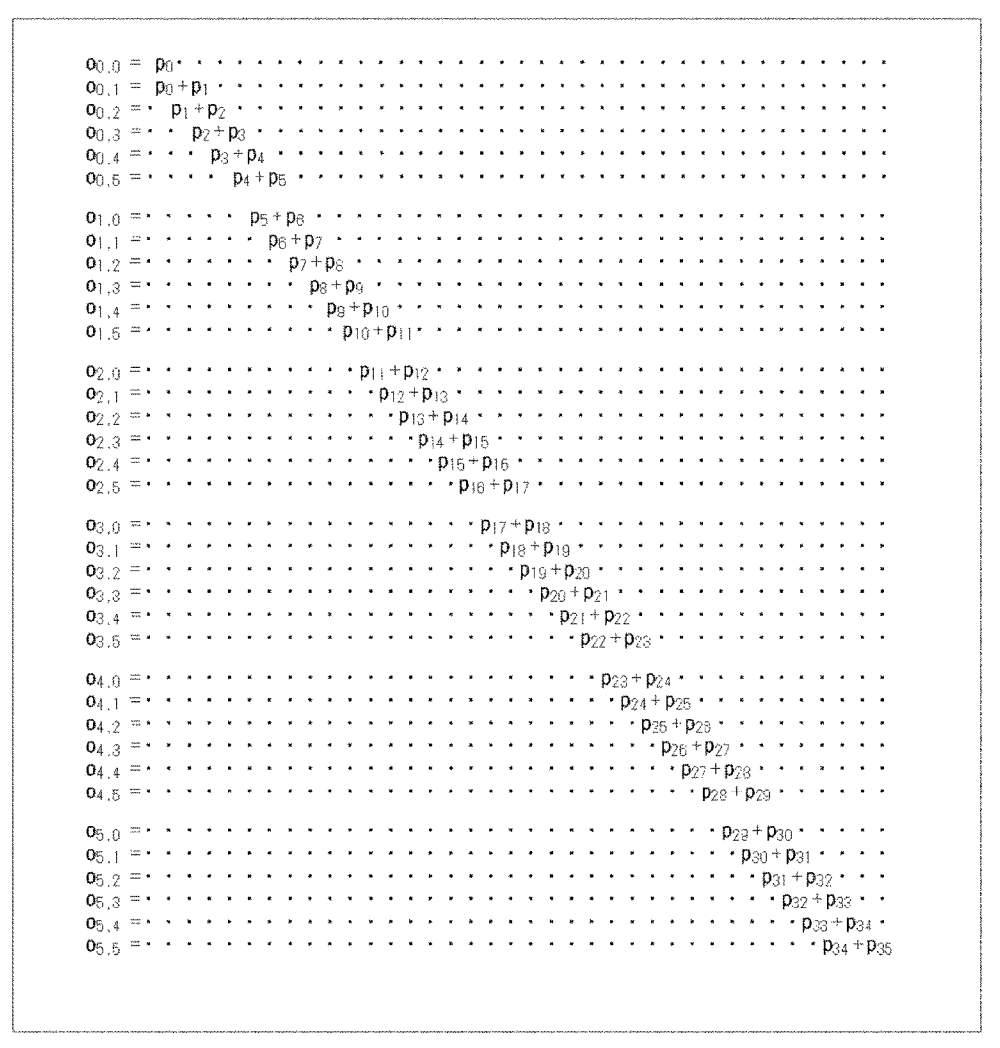
Figure 16:
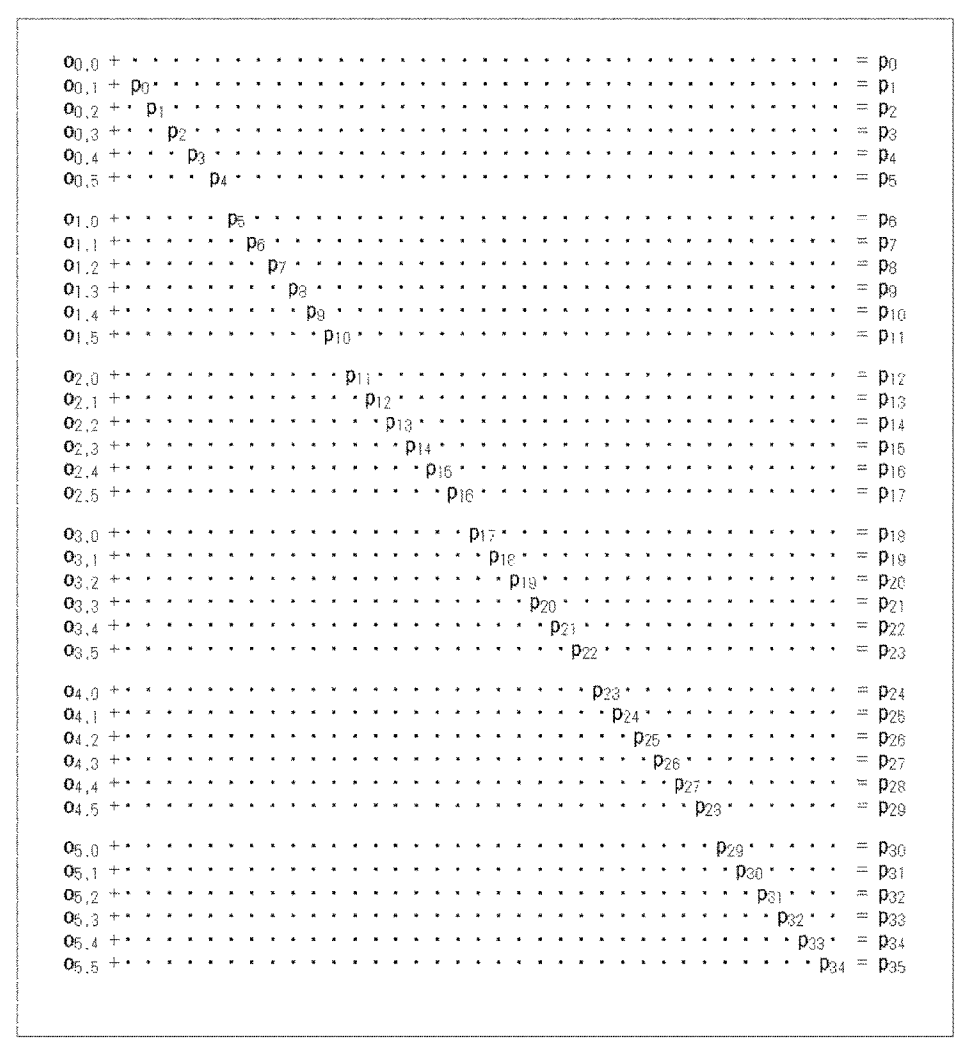

As illustrated in FIG. 15 and FIG. 16, a parity bit $p_0=o_{0,0}$ by the above-described equation (2) and equation (7). Also, by the above-described equation (3) and equation (7), $o_{0,1}+h_{1,k}p_0+p_1=0$ as illustrated in FIG. 15. Since $h_{1,k}$ is 1 in the parity check matrix H, $o_{0,1}+p_0+p_1=0$ ($o_{0,1}=p_0+p_1$). That is, as illustrated in FIG. 16, a parity bit $p_1=o_{0,0}+p_0$.

More specifically, the 2-bit sum D17 of $o_{0,0}$ and $o_{0,1}$ is supplied by the interleaver 15 to the accumulator 16 in FIG. 14, $o_{0,0}$ is supplied as the sum D61 to the adder 61 and the selector 62, and $o_{0,1}$ is supplied as the sum D62 to the adder 63. Here, since addition by the adder 63 is not yet performed, the parity bit D65 is not supplied to the adder 61. The adder 63 supplies the sum D61 as it is as the sum D63 to the selector 62.

The selector 62 selects the sum D61 from the interleaver 15 ($o_{0,0}$ in this case) on the basis of the selection signal D23 and outputs the sum as the parity bit D64 ($p_0$ in this case) to the selector 17 and the adder 63. The adder 63 adds the sum D62 from the interleaver 15 ($o_{0,1}$ in this case) and the parity bit D64 from the selector 62 and outputs an accordingly-acquired value ($o_{0,1}+p_0$ in this case) as a parity bit D65 ($p_1$ in this case) to the selector 17 and the adder 61. As a result, the parity bits D64 and D65 are combined and are output as a 2-bit parity bit D18 to the selector 17 and the adder 61.

Similarly, the accumulator 16 performs an operation of parity bits $p_2$ to $p_{n-k-1}$ by two bits by the equations illustrated in FIG. 15 or FIG. 16 and outputs this as a parity bit D18.

Figure 17:
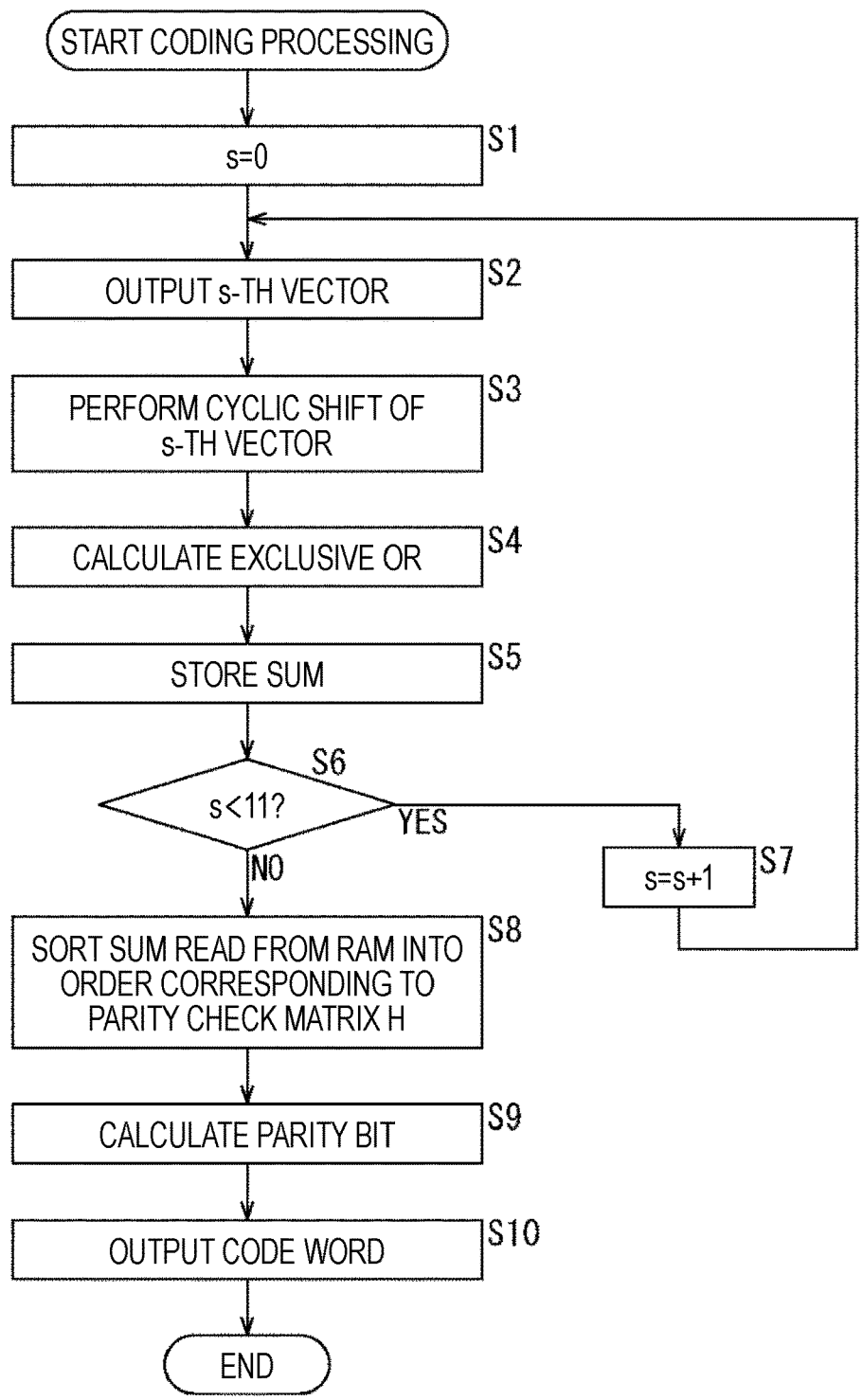
FIG. 17 is a flowchart for describing coding processing by a coding device in FIG. 8.

Next, coding processing by the coding device 1 in FIG. 8 will be described with reference to a flowchart in FIG. 17. This coding processing is started, for example, when an information word D11 (information word i) is input in a unit of two bits.

In step S1, the bit-width adjustment circuit 11 sets a number s of a vector of an information word D12, which is output to the cyclic shift circuit 12, as 0 and goes to step S2.

In step S2, information words D11 input in a unit of two bits are combined into six bits and supplied as an sth vector (information word D12) to the cyclic shift circuit 12 by the bit-width adjustment circuit 11.

After the processing in step S2, the processing goes to step S3. On the basis of a control signal D21 from the control unit 18, the cyclic shift circuit 12 calculates the product (h×i) of a value h in each row of a constitutive matrix that is not a zero matrix among constitutive matrices included in an information part of the parity check matrix H' and the sth vector by performing cyclic shift of the sth vector, and supplies the product as the 6-bit product D13 to the adder 13.

After the processing in step S3, the processing goes to step S4. The adder 13 calculates, for each bit, the exclusive OR of the 6-bit product D13 from the cyclic shift circuit 12 and the 6-bit sum D14 supplied by the RAM 14 in step S5 described later, and supplies an accordingly-acquired 6-bit value as the sum D15 to the RAM 14. Note that in first step S3, the sum D14 is not supplied by the RAM 14. Thus, the adder 13 supplies the product D13 as it is as the sum D15 to the RAM 14.

After the processing in step S4, the processing goes to step S5. The RAM 14 stores the sum D15 from the adder 13 in a unit of six bits on the basis of a control signal D22 from the control unit 18. Also, the RAM 14 reads the already-stored sum D15 in a unit of six bits or two bits. The RAM 14 supplies the sum D15 read in a unit of six bits to the adder 13 as the sum D14 or supplies the sum D15 read in a unit of two bits to the interleaver 15 as the sum D16.

After the processing in step S5, the processing goes to step S6. The bit-width adjustment circuit 11 determines whether the number s of a vector is smaller than 11. In a case where it is determined that the number is smaller than 11, the processing goes to step S7.

In step S7, the bit-width adjustment circuit 11 increments the number s of the vector for 1, goes back to step S2, and repeats the above-described processing.

On the other hand, in a case where it is determined in step S6 that the number s of the vector is not smaller than 11 (is 11 or larger), the processing goes to step S8. The interleaver 15 sorts the sum D16 supplied by the RAM 14 in step S5 into the order corresponding to the parity check matrix H, and supplies the sorted sum D17 to the accumulator 16.

After the processing in step S8, the processing goes to step S9. The accumulator 16 performs a predetermined operation by using the sum D17 from the interleaver 15, supplies an accordingly-acquired parity bit p as the parity bit D18 in a unit of two bits to the selector 17, and goes to step S10.

In step S10, the selector 17 outputs a code word c by outputting the parity bit D18, which is supplied by the accumulator 16 in step S9, as a code word D20 in a unit of two bits after outputting, as code words D20, all information words D19 delayed and input in a unit of two bits and ends the processing.

In the above manner, in the coding device 1 in FIG. 8, the adder 13 integrates, for each row in a unit of six bits, the product of a 6-bit information word D12 and an information part of the parity check matrix H, the information part corresponding to the information word D12, and stores the accordingly-acquired sum D15 into the RAM 14, and the accumulator 16 integrates the sum D17 corresponding to the 2-bit sum D16 (D15) read from the RAM 14 and outputs an accordingly-acquired 2-bit parity bit D18 as a parity bit p of a code word c of an LDPC code. Thus, it is possible to decrease a circuit size of a coding device without changing an operation speed of coding of a linear code.

In the above description, the number of columns k of an information part of the parity check matrix H is 102 and the number of rows (or the number of columns) P of the constitutive matrix is 6. However, the number of columns k of the information part and the number of rows P of the constitutive matrix are not limited to these. For example, the coding device 1 can be applied to a parity check matrix H, in which an information length of an information word i is larger than 102 and the number of columns k of an information part is large, and can be also applied to a parity check matrix H dividable with a square matrix larger than 6×6 as a constitutive matrix.

Also, in the above description, a bit length of the RAM 104 is two, a word length thereof is six, and the number of pieces thereof is three. However, a bit length, a word length, and the number of pieces are not limited to these and there is a degree of freedom. Moreover, a bit length of the sum D104 that can be simultaneously read from or written into the RAM 104 can be any value.

In the above description, the description is made on the assumption that an LDPC code is binary. In a case where one bit is not binary and is expressed by $\{0, \ldots q\}$ ($q>1$), multiplication and division are also necessary in an operation of a parity bit p performed by the accumulator 16.

Also, in a case where a barrel shifter is used as each of the above-described cyclic shift circuits 12 and 102, it is possible to decrease a circuit size.

2. Description of DVB-Like LDPC Code

Figure 18:
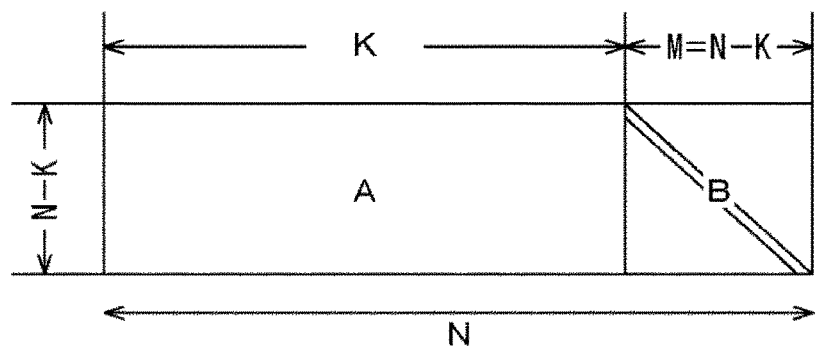
FIG. 18 is a view also illustrating the parity check matrix H used in the coding device in FIG. 8.

Next, a DVB-Like LDPC code will be described.
<Parity Check Matrix of LDPC Code>
FIG. 18 is a view also illustrating the parity check matrix H used in LDPC coding in the coding device 1 in FIG. 8.

An information length K and a parity length M with respect to an LDPC code with a code length N is determined by a code rate. Also, the parity check matrix H is a matrix with rows×columns being M×N (matrix with M rows and N columns). In a case where an information matrix (information part in FIG. 2) corresponding to an information bit of a parity check matrix H is an A matrix and a parity matrix (parity part in FIG. 2) corresponding to a parity bit is a B matrix, the A matrix that is the information matrix is an M×K matrix, and the B matrix that is the parity matrix is an M×M matrix.

In a standard such as DVB-T.2, LDPC codes with a code length N being 64800 bits and 16200 bits are prescribed.
<Parity Interleaving>
A DVB-Like LDPC code is an LDPC code in which a parity bit of an LDPC code generated in the coding device 1 in FIG. 8 is interleaved (parity-interleaved) to a position of a different parity bit.

Parity interleaving of a DVB-Like LDPC code will be described.

An LDPC code output by the coding device 1 in FIG. 8 is, for example, an irregular repeat accumulate (IRA) code similarly to an LDPC code prescribed in a standard such as DVB-T.2. The IRA code is described, for example, in "Irregular Repeat-Accumulate Codes," H. Jin, A. Khandekar, and R. J. McEliece, in Proceedings of 2nd International Symposium on Turbo codes and Related Topics, pp. 1-8, September 2000.

Figure 19:
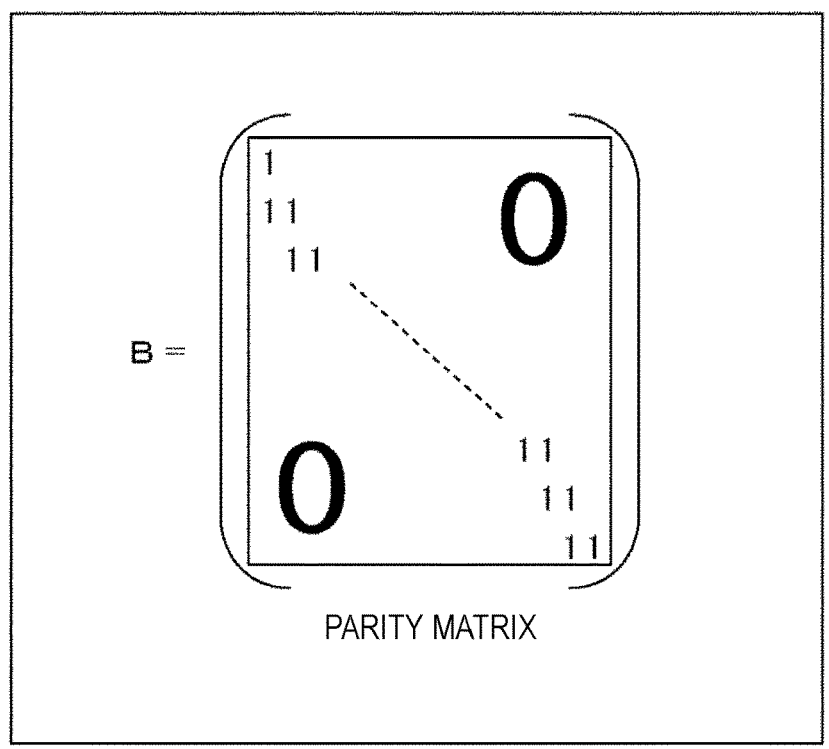
FIG. 19 is a view for describing parity interleaving.

Also, a parity matrix (B matrix) of a parity check matrix H used in LDPC coding by the coding device 1 in FIG. 8 has a stepped structure as illustrated in FIG. 19.

That is, the B matrix (parity matrix) of the parity check matrix H is a matrix having a stepped structure in which elements of 1 are arrayed in a so-called stepped manner (lower bidiagonal matrix). Row weight in the parity matrix is 1 in the first row and is 2 in each of the other rows. Also, column weight is 1 in the last one column and is 2 in each of the other columns.

In such a manner, an LDPC code of a parity check matrix H in which a parity matrix (B matrix) has a stepped structure can be easily generated by utilization of the parity check matrix H.

Figure 20:
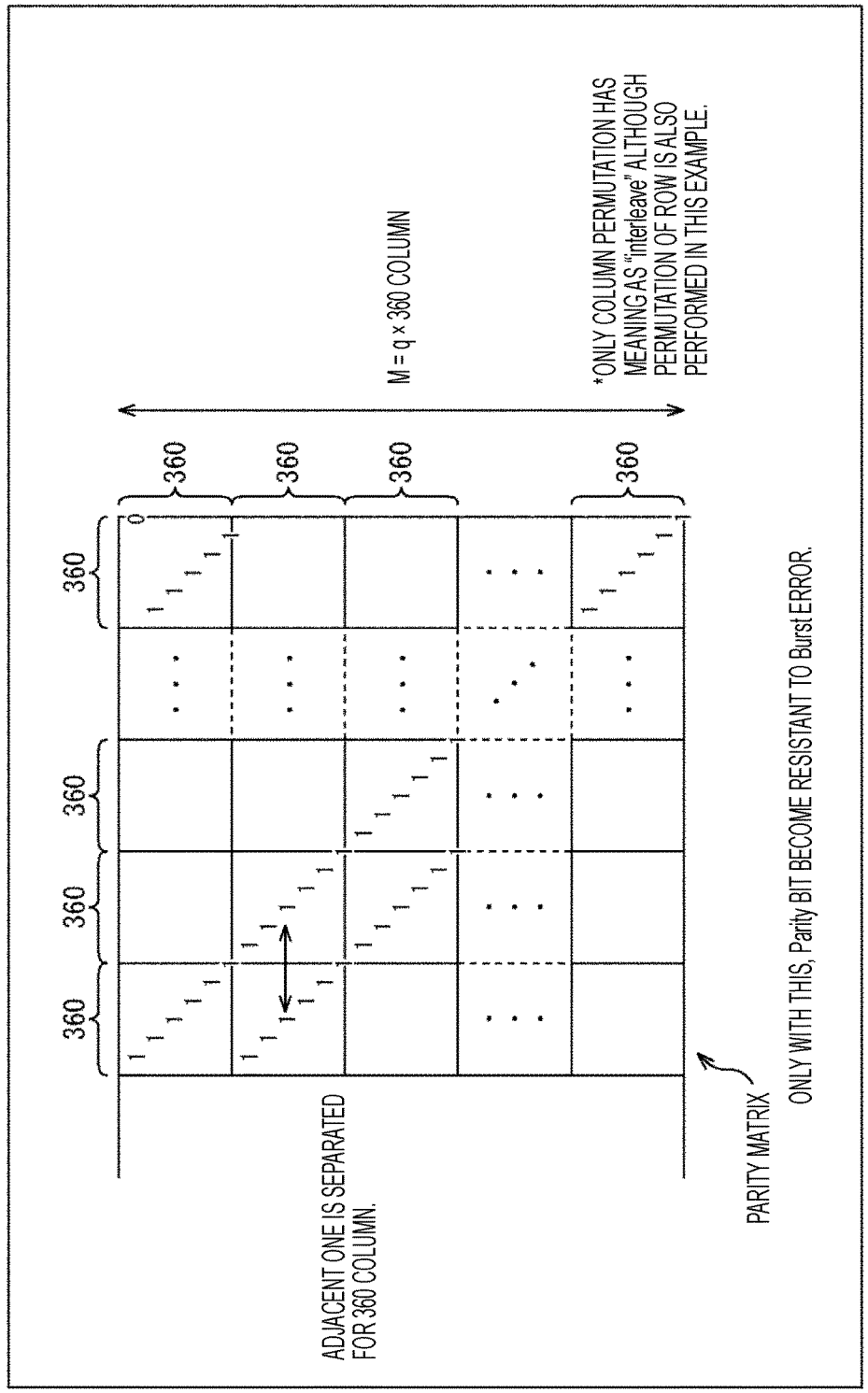
FIG. 20 is a view illustrating a parity matrix of a parity check matrix H corresponding to an LDPC code after parity interleaving.

FIG. 20 is a view illustrating a parity matrix of a parity check matrix H corresponding to an LDPC code after parity interleaving.

Here, an information matrix (A matrix) of a parity check matrix H corresponding to an LDPC code output by the coding device 1 in FIG. 8 has a cyclic structure similarly to an information matrix of a parity check matrix H corresponding to an LDPC code prescribed in a standard such as DVB-T.2.

The cyclic structure is a structure in which a certain column matches a cyclic-shifted different column. For example, a structure in which a position of 1 in each row in P columns is, for each P columns, in a position in which a first column of the P columns is cyclic-shifted in a column direction for a predetermined value such as a value proportional to a value q acquired by division of a parity length M is included. In the following, P columns in a cyclic structure will be arbitrarily referred to as a unit size.

As described above, as LDPC codes prescribed in a standard such as DVB-T.2, there are two kinds of LDPC codes with a code length N being 64800 bits and 16200 bits. A unit size P of each of the two kinds of LDPC codes is prescribed to 360 that is one of divisors excluding 1 and M among divisors of the parity length M.

Also, the parity length M is a value other than a prime number expressed, with a value q that varies depending on a code rate, by an equation $M=q \times P=q \times 360$. Thus, similarly to the unit size P, the value q is also a different one of the divisors excluding 1 and M among the divisors of the parity length M and is acquired by division of the parity length M by the unit size P (the product of P and q that are divisors of the parity length M become the parity length M).

As described above, in a case where an information length is K, an integer number equal to or larger than 0 and smaller than P is x, and an integer number equal to or larger than 0 and smaller than q is y, a parity interleaver that performs parity interleaving of an LDPC code (such as parity interleaver 55 in FIG. 22 described later) interleaves, as parity interleaving, the (K+qx+y+1)st code bit among code bits of an N-bit LDPC code to a position of the (K+Py+x+1)st code bit.

Since being the (K+1)st code bit or a code bit thereafter, each of the (K+qx+y+1)st code bit and the (K+Py+x+1)st code bit is a parity bit. Thus, a position of a parity bit of an LDPC code is moved by the parity interleaving.

According to such parity interleaving, it is possible to improve resistance to a burst error.

Note that an LDPC code after parity interleaving of interleaving the (K+qx+y+1)st code bit to a position of the (K+Py+x+1)st code bit matches an LDPC code of a parity check matrix acquired by column permutation of permutating the (K+qx+y+1)st column of an original parity check matrix H to the (K+Py+x+1)st column thereof (hereinafter, also referred to as conversion parity check matrix).

Also, a pseudo cyclic structure in a unit of P columns (360 columns in FIG. 20) appears in a parity matrix of a conversion parity check matrix as illustrated in FIG. 20.

Here, the pseudo cyclic structure means a structure that has a cyclic structure other than a part thereof.

A conversion parity check matrix acquired by column permutation, which corresponds to parity interleaving, with respect to a parity check matrix of an LDPC code prescribed in a standard such as DVB-T.2 does not have a (complete) cyclic structure and has, in a manner, a pseudo cyclic structure in a point that only one element of 1 is in short (is an element of 0) in a part of 360 rows×360 columns in an upper right corner part (shift matrix) of the conversion parity check matrix.

Similarly, for example, to a conversion parity check matrix with respect to a parity check matrix of an LDPC code prescribed in a standard such as DVB-T.2, a conversion parity check matrix with respect to a parity check matrix of an LDPC code output by the coding device 1 in FIG. 8 has a pseudo cyclic structure.

Note that the conversion parity check matrix in FIG. 20 is a matrix in which permutation of a row (row permutation) to make the conversion parity check matrix include a constitutive matrix described later is performed with respect to an original parity check matrix H other than column permutation corresponding to parity interleaving.

3. Description of LDPC Code in ETRI Format

Next, an LDPC code in an ETRI format will be described.

Figure 21:
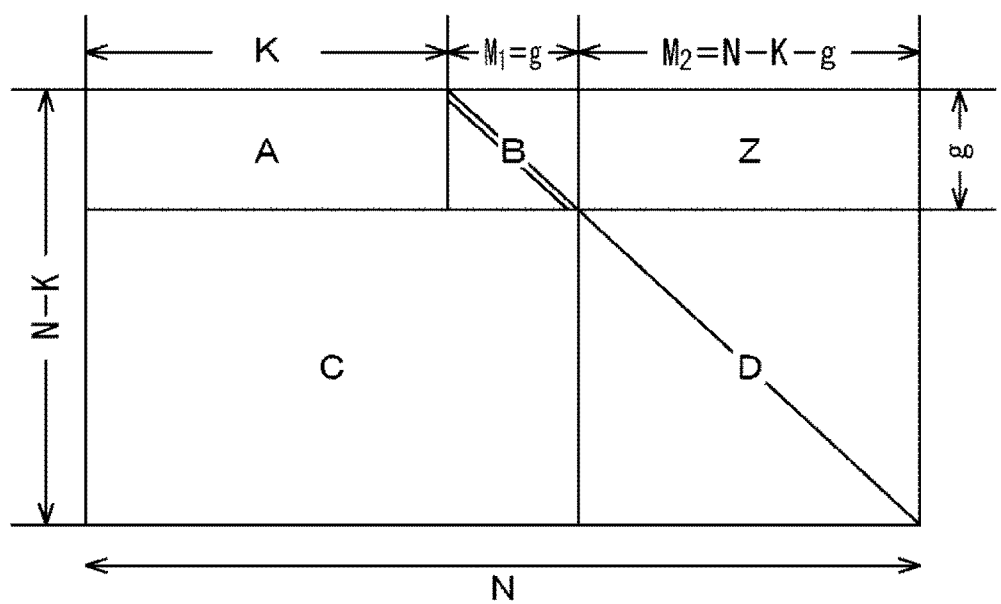
FIG. 21 is a view illustrating a structure of a parity check matrix H in an ETRI format.

FIG. 21 is a view illustrating a structure of a parity check matrix H in the ETRI format.

A parity check matrix H in the ETRI format includes an A matrix, a B matrix, a C matrix, a D matrix, and a Z matrix.

The A matrix is an upper left matrix, in the parity check matrix, which has g rows and K columns expressed with a predetermined value g and an information length K of an LDPC code=code length N× code rate r. The A matrix is the same with the information matrix of the parity check matrix H of the LDPC code illustrated in FIG. 18.

The B matrix is a matrix with g rows and g columns which matrix has a stepped structure and is adjacent to the right side of the A matrix. The B matrix is the same with the parity matrix of the parity check matrix H of the LDPC code illustrated in FIG. 18.

The C matrix is a matrix with (N−K−g) rows and (K+g) columns which matrix is adjacent to the bottom of the A matrix and the B matrix.

The D matrix is an identity matrix with (N−K−g) rows and (N−K−g) columns which matrix is adjacent to the right side of the C matrix.

The Z matrix is a zero matrix with g rows and (N−K−g) columns which matrix is adjacent to the right side of the B matrix.

Similarly to an information matrix of a parity check matrix of a DVB-Like LDPC code, each of the A matrix and the C matrix has a cyclic structure in each 360 columns (unit size P).

An LDPC code in the ETRI format is an LDPC code acquired by interleaving (parity interleaving) of a parity bit corresponding to a B matrix and a D matrix of an LDPC code that is LDPC-coded by utilization of such a parity check matrix H in the ETRI format.

As described above, an A matrix and a B matrix of the parity check matrix H in the ETRI format are common to the parity check matrix H used for LDPC-coding of a DVB-Like LDPC code. Also, a Z matrix is a zero matrix. Thus, an LDPC code in the ETRI format can be generated by LDPC coding in two stages in the following manner.

That is, first, a coding device generates a DVB-Like LDPC code by performing LDPC coding by using a first parity check matrix $H_{AB}=[A|B]$ having an element of the A matrix as an element on a left side and an element of the B matrix as an element on a right side in the same manner with a parity check matrix H in a DVB-Like format and by performing parity interleaving of a parity bit (part corresponding to B matrix) of an accordingly-acquired LDPC code. Next, the coding device can generate an LDPC code in the ETRI format by performing LDPC-coding with the generated DVB-Like LDPC code as LDPC target data by using a matrix to be a difference between the parity check matrix H of the DVB-Like LDPC code (FIG. 18) and the parity check matrix H in the ETRI format (FIG. 21), that is, a second parity check matrix $H_{CD}=[C|D]$ having an element of the C matrix as an element on a left side and an element of the D matrix as an element on a right side and by performing parity interleaving of a parity bit (part corresponding to D matrix) of an accordingly-acquired LDPC code.

In the above, each of an LDPC code, a DVB-Like LDPC code, and an LDPC code in the ETRI format has been described.

4. First Embodiment

In the following, a coding device corresponding to LDPC coding in both formats of a DVB-Like LDPC code and an LDPC code in an ETRI format will be described. Hereinafter, a format of the DVB-Like LDPC code will be also simply referred to as a DVB-Like format and a format of the LDPC code in the ETRI format will be also simply referred to as an ETRI format.

<Configuration Example of Coding Device>

FIG. 22 is a block diagram illustrating a configuration example of a first embodiment of a coding device employing the present technology.

A coding device 50 illustrated in FIG. 22 includes an AB matrix encoder 51, a B matrix parity interleaver 52, a CD matrix encoder 53, a selector 54, a parity interleaver 55, and a control unit 56.

An information word i is input into the coding device 50. The coding device 50 performs LDPC coding of the input information word i in the DVB-Like format or the ETRI format and outputs an accordingly-acquired code word c. Here, the code word c output from the coding device 50 is different from the code word c output from the coding device 1 in FIG. 8.

The AB matrix encoder 51 performs LDPC coding with respect to the input information word i by using a first parity check matrix $H_{AB}$=[A|B] having an element of an A matrix as an element on a left side and an element of a B matrix as an element on a right side in the same manner with the parity check matrix H in the DVB-Like format which matrix has been described with reference to FIG. 18 and the like.

In other words, the AB matrix encoder 51 has a configuration similar to that of the coding device 1 in FIG. 8, performs LDPC coding to code LDPC target data into an LDPC code (corresponding to parity check matrix) prescribed in a predetermined standard such as DVB-S.2, DVB-T.2, or DVB-C.2, and outputs an accordingly-acquired LDPC code. In the following, an LDPC code output by the AB matrix encoder 51 with respect to the information word i input as the LDPC target data is expressed as $i+p_B$.

The B matrix parity interleaver 52 performs parity interleaving to interleave a parity bit $p_B$ of the LDPC code $i+p_B$ generated in the AB matrix encoder 51 to a position of a different parity bit and supplies an LDPC code after the parity interleaving to the CD matrix encoder 53. The LDPC code after the parity interleaving by the B matrix parity interleaver 52 is expressed as $i+p_B'$.

The CD matrix encoder 53 performs LDPC coding of the LDPC code $i+p_B'$, which is supplied by the B matrix parity interleaver 52, by using a second parity check matrix $H_{CD}$=[C|D] having an element of a C matrix as an element on a left side and an element of a D matrix as an element on a right side.

Figure 23:
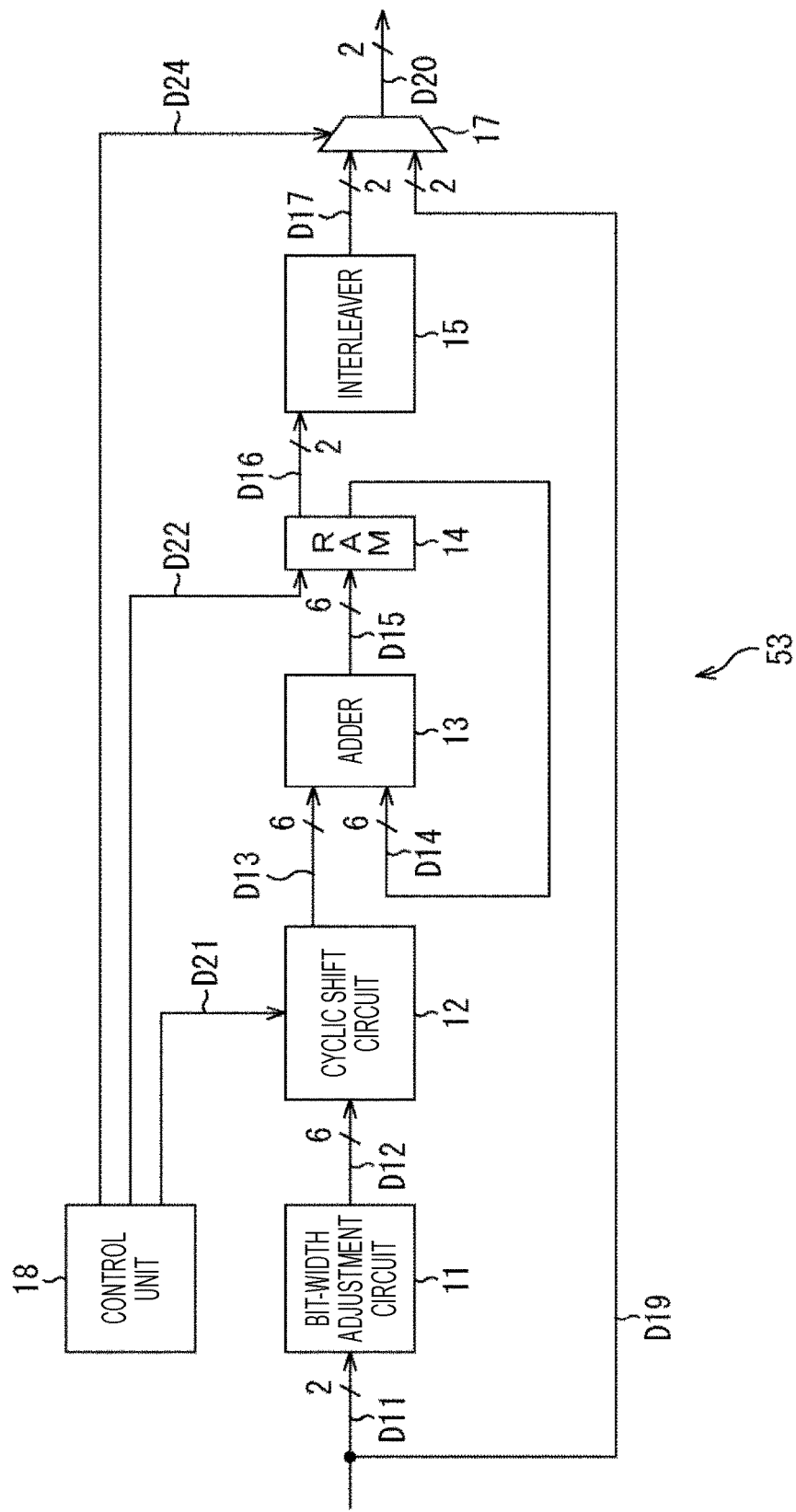
FIG. 23 is a block diagram illustrating a detailed configuration example of a CD matrix encoder.

FIG. 23 is a block diagram illustrating a detailed configuration example of the CD matrix encoder 53.

The CD matrix encoder 53 can be realized with a configuration in which an accumulator 16 is omitted from the coding device 1 illustrated in FIG. 8.

The CD matrix encoder 53 performs LDPC coding by using the second parity check matrix $H_{CD}$ regarding the LDPC code $i+p_B'$, which is supplied by the B matrix parity interleaver 52, as an information word i of an input in the coding device 1 in FIG. 8. However, integration processing by the accumulator 16 in the coding device 1 in FIG. 8 is not executed.

Referring back to FIG. 22, the CD matrix encoder 53 outputs an LDPC code acquired as a result of the LDPC coding using the second parity check matrix $H_{CD}$. In the following, the LDPC code output by the CD matrix encoder 53 is expressed as $i+p_B'+p_D$.

Under control of the control unit 56, the selector 54 selects one of two inputs, and outputs the selected one to the parity interleaver 55 in the following stage. More specifically, the selector 54 selects an input from the AB matrix encoder 51 and performs an output thereof to the parity interleaver 55 in a case where a select control signal of "0" corresponding to coding in the DVB-Like format is supplied by the control unit 56, and selects an input from the CD matrix encoder 53 and performs an output to the parity interleaver 55 in a case where a select control signal of "1" corresponding to coding in the ETRI format is supplied.

In other words, the selector 54 selects the LDPC code $i+p_B$ from the AB matrix encoder 51 and performs an output thereof to the parity interleaver 55 in a case where a select control signal of "0" corresponding to coding in the DVB-Like format is supplied by the control unit 56, and selects the LDPC code $i+p_B'+p_D$ from the CD matrix encoder 53 and performs an output thereof to the parity interleaver 55 in a case where a select control signal of "1" corresponding to coding in the ETRI format is supplied.

The parity interleaver 55 performs parity interleaving to interleave a parity bit of an LDPC code to a position of a different parity bit.

More specifically, in a case where the LDPC code $i+p_B$ corresponding to coding in the DVB-Like format is input by the selector 54, similarly to the B matrix parity interleaver 52, the parity interleaver 55 interleaves a parity bit $p_B$ of the LDPC code $i+p_B$ and outputs, as a code word c, an LDPC code $i+p_B'$ after the parity interleaving.

On the other hand, in a case where the LDPC code $i+p_B'+p_D$ corresponding to coding in the ETRI format is input by the selector 54, the parity interleaver 55 interleaves a parity bit $p_D$ of the LDPC code $i+p_B'+p_D$ and outputs, as a code word c, an LDPC code $i+p_B'+p_D'$ after the parity interleaving.

The control unit 56 supplies, to the selector 54, a select control signal for selection of an input according to whether a format of a generated LDPC code is the DVB-Like format or the ETRI format. More specifically, the control unit 56 supplies a select control signal indicating "0" in a case where a format of a generated LDPC code is the DVB-Like format, and supplies a select control signal indicating "1" in a case where a format of a generated LDPC code is the ETRI format.

<LDPC Coding Processing>

LDPC coding processing by the coding device 50 in FIG. 22 will be described with reference to a flowchart in FIG. 24.

First, in step S31, the control unit 56 supplies, to the selector 54, a select control signal corresponding to whether a format of a generated LDPC code is the DVB-Like format or the ETRI format. Note that processing in this step only needs to be performed until data to be selected is input into the selector 54 and is not necessarily executed in the beginning of the LDPC coding processing.

In step S32, the AB matrix encoder 51 performs LDPC coding of an input information word i by using a first parity check matrix $H_{AB}$. The AB matrix encoder 51 outputs an LDPC code $i+p_B$ acquired as a result of the LDPC coding.

In following step S33, parity interleaving to interleave a parity bit $p_B$ of the LDPC code $i+p_B$ output from the AB matrix encoder 51 to a position of a different parity bit is executed. This parity interleaving is executed by the parity interleaver 55 in a case where a format of a generated LDPC code is the DVB-Like format, and is executed by the B matrix parity interleaver 52 in a case where a format of a generated LDPC code is the ETRI format.

That is, in a case where a format of a generated LDPC code is the DVB-Like format, the LDPC code $i+p_B$ generated by the AB matrix encoder 51 is supplied to the parity interleaver 55 via the selector 54. In step S33, the parity interleaver 55 performs parity interleaving to interleave the parity bit $p_B$ of the LDPC code $i+p_B$ generated by the AB matrix encoder 51 to a position of a different parity bit and generates an LDPC code i+$p_B$' after the parity interleaving. The LDPC code i+$p_B$' after the parity interleaving which code is generated by the parity interleaver 55 is output as a code word c.

On the other hand, in a case where a format of a generated LDPC code is the ETRI format, the LDPC code i+$p_B$ generated by the AB matrix encoder 51 is supplied to the B matrix parity interleaver 52. The B matrix parity interleaver 52 performs parity interleaving to interleave the parity bit $p_B$ of the LDPC code i+$p_B$ generated by the AB matrix encoder 51 to a position of a different parity bit and generates an LDPC code i+$p_B$' after the parity interleaving. The LDPC code i+$p_B$' after the parity interleaving which code is generated by the B matrix parity interleaver 52 is output to the CD matrix encoder 53.

The processing in step S34 varies depending on whether a format of a generated LDPC code is the DVB-Like format or the ETRI format.

Figure 24:
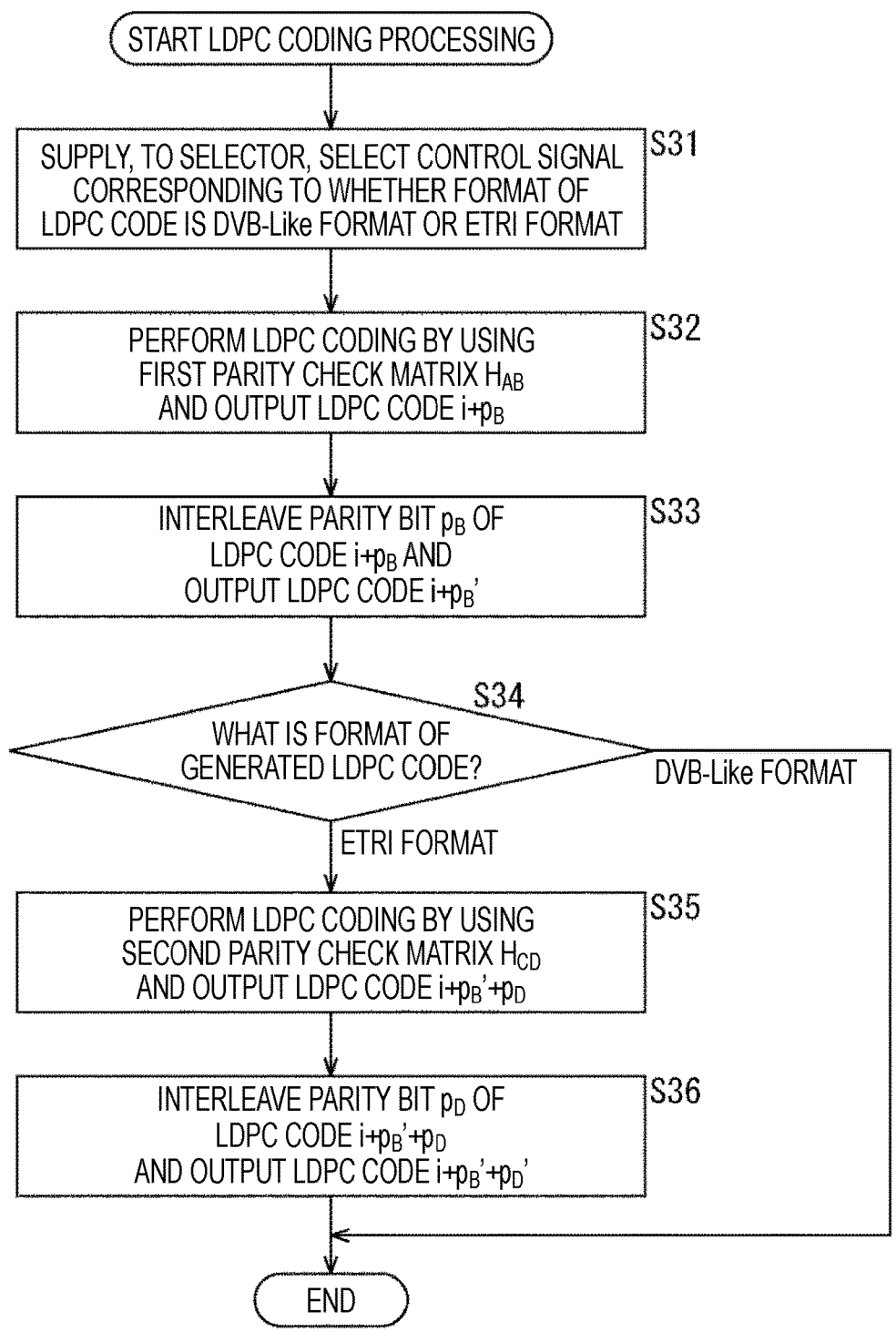
FIG. 24 is a flowchart for describing LDPC coding processing by the coding device in FIG. 22.

In step S34, the LDPC coding processing in FIG. 24 is ended in a case where a format of a generated LDPC code is the DVB-Like format.

On the other hand, in step S34, the processing goes to step S35 in a case where a format of a generated LDPC code is the ETRI format.

In step S35, the CD matrix encoder 53 performs LDPC coding by using a second parity check matrix $H_{CD}$ with the LDPC code i+$p_B$' supplied by the B matrix parity interleaver 52 as LDPC target data. The CD matrix encoder 53 outputs an LDPC code i+$p_B$'+$p_D$ acquired as a result of the LDPC coding to the parity interleaver 55 via the selector 54.

In step S36, the parity interleaver 55 interleaves a parity bit $p_D$ of the LDPC code i+$p_B$'+$p_D$ output from the CD matrix encoder 53, outputs an LDPC code i+$p_B$'+$p_D$' after the parity interleaving as a code word c, and ends the LDPC coding processing in FIG. 24.

As described above, regardless of whether a format of a generated LDPC code is the DVB-Like format or the ETRI format, it is possible to generate an LDPC code corresponding to these formats according to the coding device 50 of the first embodiment.

Thus, according to the coding device 50 in FIG. 22, it is possible to correspond to both of a DVB-Like LDPC code and an LDPC code in the ETRI format.

5. Second Embodiment

<Configuration Example of Coding Device>

Figure 25:
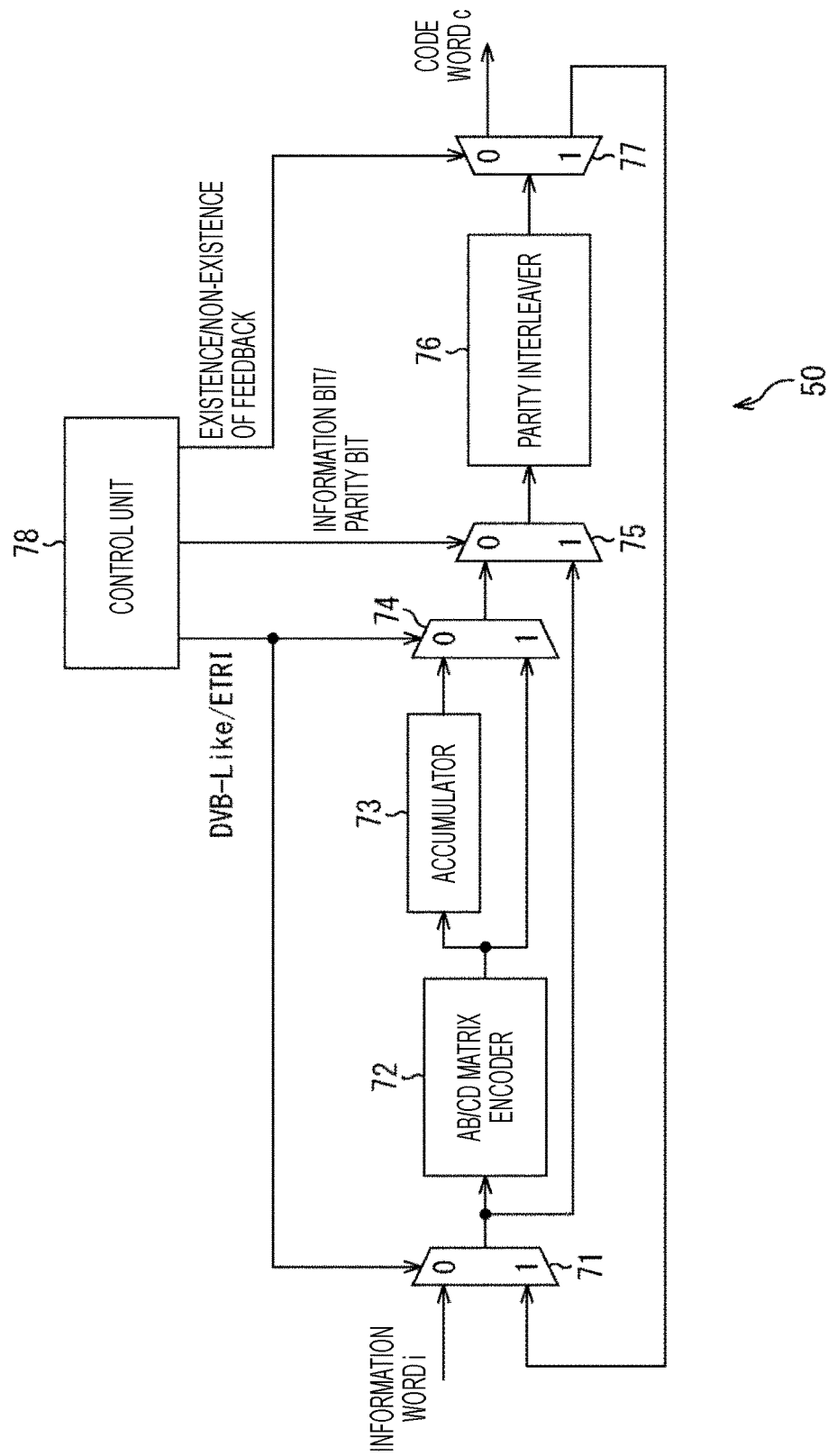
FIG. 25 is a block diagram illustrating a configuration example of a second embodiment of a coding device employing the present technology.

FIG. 25 is a block diagram illustrating a configuration example of a second embodiment of a coding device employing the present technology.

A coding device 50 illustrated in FIG. 25 includes a selector 71, an AB/CD matrix encoder 72, an accumulator 73, selectors 74 and 75, a parity interleaver 76, a selector 77, and a control unit 78.

Under control of the control unit 78, the selector 71 selects one of two inputs, and outputs the selected one to the AB/CD matrix encoder 72 and the selector 75 in the following stage. More specifically, in a case where a first select control signal of "0" corresponding to coding in the DVB-Like format is supplied by the control unit 78, the selector 71 selects an input from the outside of the device and performs an output thereof to the AB/CD matrix encoder 72 and the selector 75. On the other hand, in a case where a first select control signal of "1" corresponding to coding in the ETRI format is supplied, the selector 71 selects information fed back from the selector 77 and performs an output thereof to the AB/CD matrix encoder 72 and the selector 75.

The AB/CD matrix encoder 72 is configured similarly to the CD matrix encoder 53 in the first embodiment illustrated in FIG. 23.

The AB/CD matrix encoder 72 includes, in an inner memory, a plurality of kinds of first parity check matrices $H_{AB}$ used in LDPC coding in both of the DVB-Like format and the ETRI format and second parity check matrices $H_{CD}$ used in LDPC coding in the ETRI format according to various code rates or code lengths N. Along with a first select control signal or the like supplied to the selectors 71 and 74, it is set in the AB/CD matrix encoder 72 by the control unit 78 which kind of parity check matrix is to be used.

In a case where it is instructed by the control unit 78 to perform coding of using a first parity check matrix $H_{AB}$, the AB/CD matrix encoder 72 performs LDPC coding of input LDPC target data by using the first parity check matrix $H_{AB}$. On the other hand, in a case where it is instructed by the control unit 78 to perform coding of using a second parity check matrix $H_{CD}$, the AB/CD matrix encoder 72 performs LDPC coding of input LDPC target data by using the second parity check matrix $H_{CD}$. However, since an accumulator 16 is omitted in the AB/CD matrix encoder 72 similarly to the CD matrix encoder 53 in the first embodiment, integration processing by the accumulator 16 in the coding device 1 in FIG. 8 is not executed.

The AB/CD matrix encoder 72 supplies a result of the LDPC coding to the accumulator 73 and the selector 74.

The accumulator 73 performs processing similar to that by the accumulator 16 of the coding device 1 in FIG. 8. That is, the accumulator 73 executes integration processing of a parity bit of an LDPC code supplied by the AB/CD matrix encoder 72, and outputs a result of the processing to the selector 74.

Under control of the control unit 78, the selector 74 selects one of two inputs, and outputs the selected one to the selector 75 in the following stage. More specifically, the selector 74 selects an output from the accumulator 73 and performs an output thereof to the selector 75 in a case where a first select control signal of "0" corresponding to coding in the DVB-Like format is supplied by the control unit 78, and selects an output from the AB/CD matrix encoder 72 and performs an output thereof to the selector 75 in a case where a first select control signal of "1" corresponding to coding in the ETRI format is supplied.

Under control of the control unit 78, the selector 75 selects one of two inputs, and outputs the selected one to the parity interleaver 76 in the following stage. A second select control signal corresponding to whether input data is an information bit or a parity bit is supplied to the selector 75.

In a case where a second select control signal of "1" corresponding to an information bit is supplied by the control unit 78, the selector 75 selects an output from the selector 71 and performs an output thereof to the parity interleaver 76. On the other hand, in a case where a second select control signal of "0" corresponding to a parity bit is supplied by the control unit 78, the selector 75 selects an output from the selector 74 and performs an output thereof to the parity interleaver 76.

The parity interleaver 76 performs processing similar to that by the parity interleaver 55 in the first embodiment illustrated in FIG. 22. That is, the parity interleaver 76 performs parity interleaving to interleave a parity bit of an LDPC code, which is supplied by the selector 75, to a position of a different parity bit.

Under control of the control unit 78, the selector 77 selects one of two output destinations and outputs input data to the selected one. More specifically, in a case where a third select control signal of "0" indicating an external output is supplied by the control unit 78, the selector 77 outputs input data to the outside as a code word c. On the other hand, in a case where a third select control signal of "1" indicating feedback is supplied by the control unit 78, the selector 77 outputs input data to an input of the selector 71 which input is on a side corresponding to "1".

The control unit 78 supplies, to the selectors 71 and 74, a first select control signal of "0" corresponding to coding in the DVB-Like format or of "1" corresponding to coding in the ETRI format.

Also, the control unit 78 supplies a second select control signal corresponding to an information bit or a parity bit to the selector 75. Moreover, the control unit 78 supplies, to the selector 77, a third select control signal of "0" indicating an external output or of "1" indicating feedback. In addition, as described above, the control unit 78 arbitrarily supplies a control signal to control a coding operation to the AB/CD matrix encoder 72 or the like.

The coding device 50 in the second embodiment is configured in the above manner.

In the coding device 50 in the second embodiment, the B matrix parity interleaver 52 and the parity interleaver 55 of the first embodiment are commonalized into one parity interleaver 76, and the AB matrix encoder 51 and the CD matrix encoder 53 are commonalized into one AB/CD matrix encoder 72 with an accumulator 73 being provided in the following stage. With this arrangement, it is possible to correspond to both of a DVB-Like LDPC code and an LDPC code in the ETRI format with physical configurations less than configurations of the first embodiment.

<Generation of DVB-Like LDPC Code>

Generation of a DVB-Like LDPC code in the second embodiment will be described with reference to FIGS. 26A, 26B, and 26C.

In a case where the coding device 50 generates a DVB-Like LDPC code, the control unit 78 supplies a first select control signal of "0" corresponding to coding in the DVB-Like format to the selectors 71 and 74, and supplies, to the selector 77, a third select control signal of "0" indicating an external output.

Figure 26A:
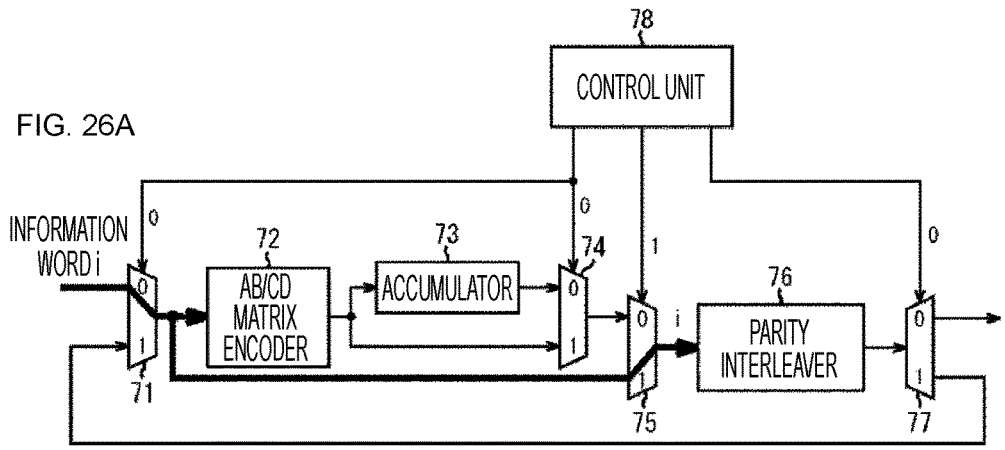
FIGS. 26A, 26B, and 26C are views for describing generation of a DVB-Like LDPC code in the second embodiment.

First, as illustrated in FIG. 26A, an information bit (information word) i as target data of LDPC coding is input into the selector 71. The information bit i input into the selector 71 is output to the AB/CD matrix encoder 72 and the selector 75.

A second select control signal of "1" corresponding to an information bit is supplied by the control unit 78 to the selector 75 at this time point. The selector 75 outputs the information bit i, which is supplied by the selector 71, to the parity interleaver 76 on the basis of the second select control signal.

After the output of the information bit i, the second select control signal supplied by the control unit 78 to the selector 75 is changed to a second select control signal of "0" corresponding to a parity bit.

Figure 26B:
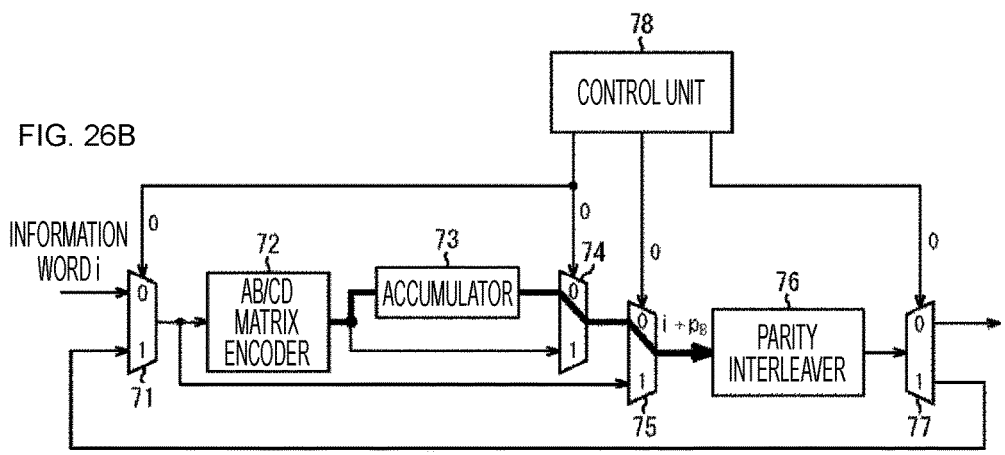

As illustrated in FIG. 26B, LDPC coding using a first parity check matrix HAB is executed with respect to the information bit i in the AB/CD matrix encoder 72 to which the information bit i is supplied by the selector 71, and integration processing of a parity bit of an LDPC code is executed in the accumulator 73, whereby an LDPC code $i+p_B$ is generated.

At this time point, since both of the first select control signal supplied to the selector 74 and the second select control signal supplied to the selector 75 are "0," the LDPC code $i+p_B$ output from the accumulator 73 is supplied to the parity interleaver 76.

Figure 26C:
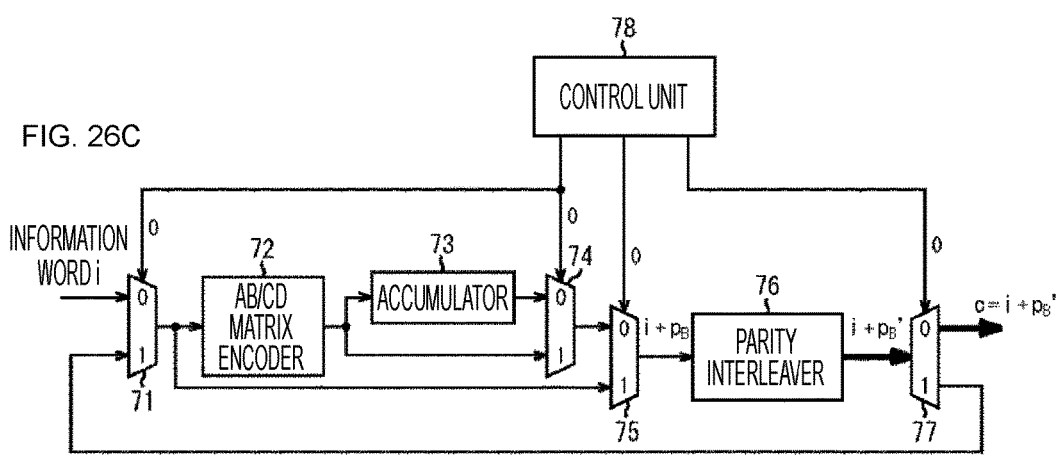

As illustrated in FIG. 26C, the parity interleaver 76 executes parity interleaving to interleave a parity bit $p_B$ of the supplied LDPC code $i+p_B$ to a position of a different parity bit, and supplies an LDPC code $i+p_B'$ after the parity interleaving to the selector 77.

Since the third select control signal of "0" indicating an external output is supplied to the selector 77, the selector 77 outputs the input LDPC code $i+p_B'$ after the parity interleaving to the outside as a code word c.

In the second embodiment, it is possible to generate and output a DVB-Like LDPC code in the above manner.

<Generation of LDPC Code in ETRI Format>

Next, generation of an LDPC code in the ETRI format in the second embodiment will be described with reference to FIGS. 27A, 27B, 27C, and 27D.

Processing in a first stage in generation of an LDPC code in the ETRI format by the coding device 50, more specifically, processing until an LDPC code $i+p_B$ is supplied to the parity interleaver 76 which processing is described with reference to FIGS. 26A and 26B is similar to that in generation of a DVB-Like LDPC code.

Figure 27A:
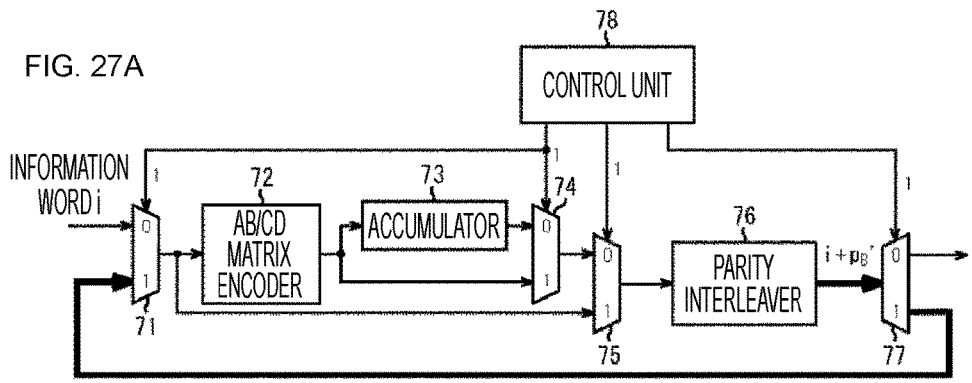
FIGS. 27A, 27B, 27C, and 27D are views for describing generation of an LDPC code in an ETRI format in the second embodiment.

Then, as illustrated in FIG. 27A, parity interleaving is executed by the parity interleaver 76, and an LDPC code $i+p_B'$ after the parity interleaving is generated and output to the selector 77. A third select control signal of "1" indicating feedback is supplied to the selector 77 at this stage.

The selector 77 feeds the LDPC code $i+p_B'$ after the parity interleaving, the code being supplied by the parity interleaver 76, back to the selector 71 on the basis of the third select control signal. After the feedback, the third select control signal supplied to the selector 77 is changed to a third select control signal of "0" indicating an external output.

Also, until the LDPC code $i+p_B'$ after the parity interleaving is fed back to the selector 71, the first select control signal supplied to the selectors 71 and 74 is changed to a first select control signal of "1" corresponding to coding in the ETRI format. The second select control signal supplied to the selector 75 is also changed to a second select control signal of "1" corresponding to an information bit.

Figure 27B:
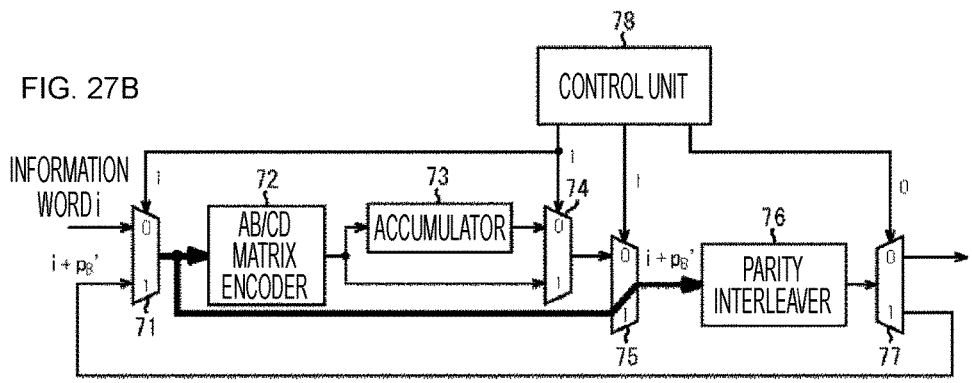

The LDPC code $i+p_B'$ after the parity interleaving which code is fed back and input to the selector 71 is output to the AB/CD matrix encoder 72 and the selector 75 as illustrated in FIG. 27B.

The second select control signal of "1" corresponding to an information bit is supplied by the control unit 78 to the selector 75 at this time point. The selector 75 outputs the LDPC code $i+p_B'$ after the parity interleaving which code is supplied by the selector 71 to the parity interleaver 76 on the basis of the second select control signal.

After the output of the LDPC code $i+p_B'$ after the parity interleaving, the second select control signal output from the control unit 78 to the selector 75 is changed to a second select control signal of "0" corresponding to a parity bit.

On the other hand, in the AB/CD matrix encoder 72 to which the LDPC code $i+p_B'$ after the parity interleaving is supplied by the selector 71, LDPC coding using a second parity check matrix $H_{CD}$ is executed with respect to the LDPC code $i+p_B'$ after the parity interleaving and an LDPC code $i+p_B'+p_D$ is generated.

Figure 27C:
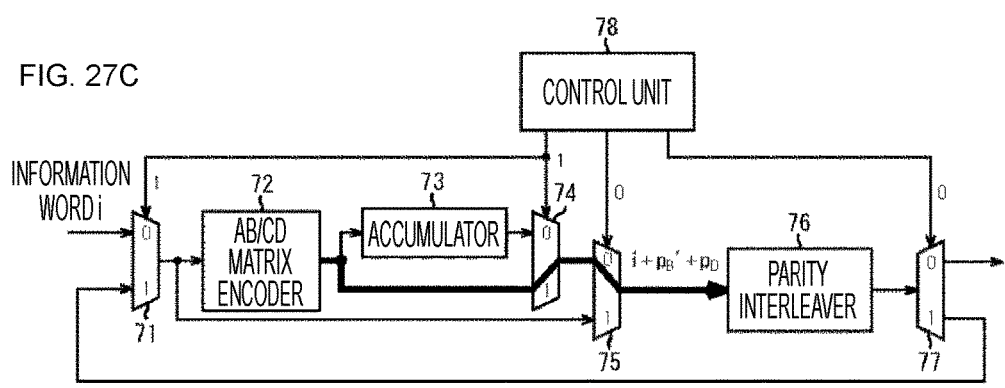

As illustrated in FIG. 27C, the LDPC code $i+p_B'+p_D$ generated in the AB/CD matrix encoder 72 is supplied to the parity interleaver 76 via the selector 74 to which the first select control signal of "1" corresponding to coding in the ETRI format is supplied, and the selector 75 to which the second select control signal of "0" corresponding to a parity bit is supplied.

Figure 27D:
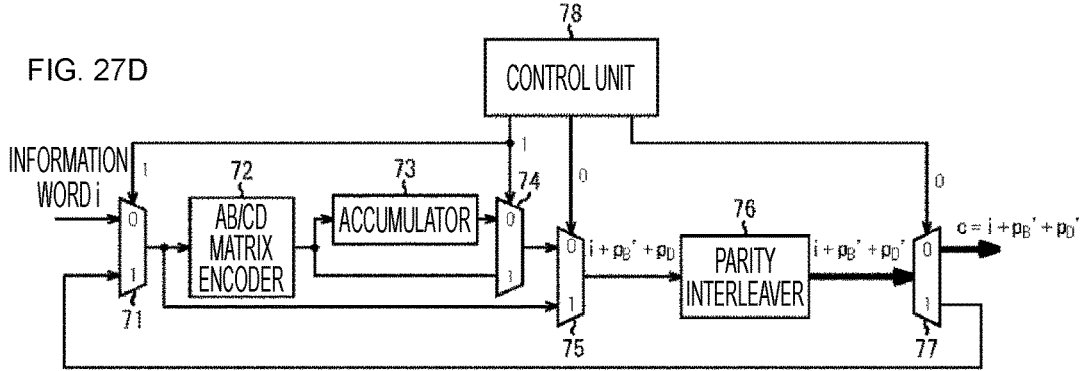

As illustrated in FIG. 27D, the parity interleaver 76 interleaves a parity bit $p_D$ of the LDPC code $i+p_B'+p_D$ and supplies an LDPC code $i+p_B'+p_D'$ after the parity interleaving to the selector 77.

Since the third select control signal of "0" indicating an external output is supplied to the selector 77, the selector 77 outputs the input LDPC code $i+p_B'+p_D'$ after the parity interleaving to the outside as a code word c.

In the second embodiment, it is possible to generate and output an LDPC code in the ETRI format in the above manner.

Thus, it is possible to correspond to both of a DVB-Like LDPC code and an LDPC code in the ETRI format according to the second embodiment.

6. Third Embodiment

<Configuration Example of Coding Device>

Figure 28:
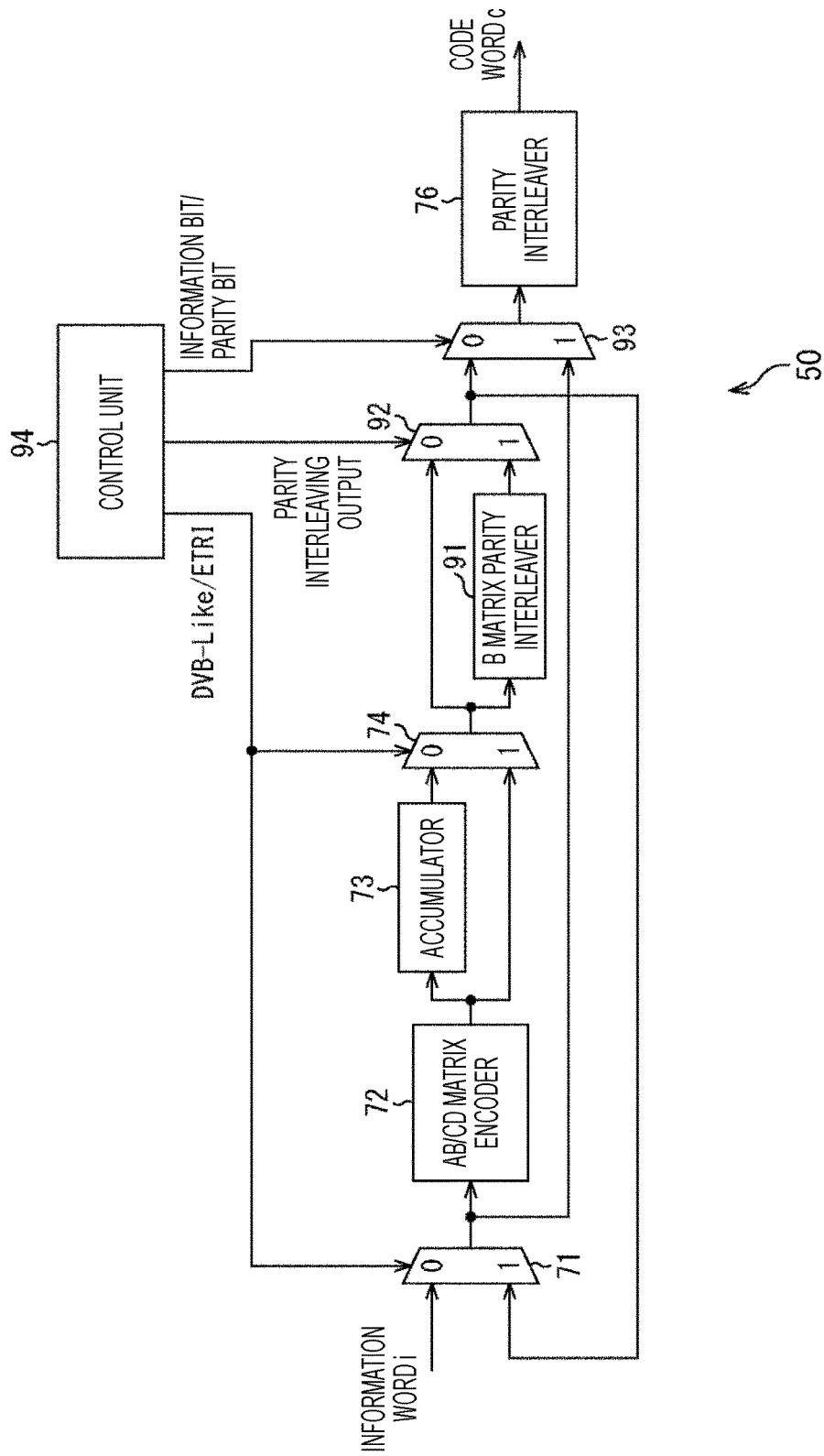
FIG. 28 is a block diagram illustrating a configuration example of a third embodiment of a coding device employing the present technology.

FIG. 28 is a block diagram illustrating a configuration example of a third embodiment of a coding device employing the present technology.

In the third embodiment in FIG. 28, the same sign is assigned to a part corresponding to that of the second embodiment in FIG. 25 and a description of the part is arbitrarily omitted.

A coding device 50 illustrated in FIG. 28 includes a selector 71, an AB/CD matrix encoder 72, an accumulator 73, a selector 74, a parity interleaver 76, a B matrix parity interleaver 91, selectors 92 and 93, and a control unit 94.

Similarly to the second embodiment, the coding device 50 of the third embodiment has a configuration in which the B matrix parity interleaver 52 and the parity interleaver 55 of the first embodiment are commonalized into one parity interleaver 76 and the AB matrix encoder 51 and the CD matrix encoder 53 are commonalized into one AB/CD matrix encoder 72 with an accumulator 73 being provided in the following stage.

In a case where the second embodiment and the third embodiment are compared, a configuration in stages after the selector 74 in the third embodiment is different from that of the second embodiment.

The B matrix parity interleaver 91 performs processing similar to that by the B matrix parity interleaver 52 in the first embodiment. That is, the B matrix parity interleaver 91 performs parity interleaving to interleave a parity bit $p_B$ of an LDPC code $i+p_B$ to a position of a different parity bit and outputs an LDPC code $i+p_B'$ after the parity interleaving.

Under control of the control unit 94, the selector 92 selects one of two inputs, and outputs the selected one to the selector 93 in the following stage. A second select control signal to be "1" only in a case where the B matrix parity interleaver 91 outputs a result of execution of parity interleaving and to be "0" in other cases is supplied to the selector 92.

Under control of the control unit 94, the selector 93 selects one of two inputs, and outputs the selected one to the parity interleaver 76 in the following stage. A third select control signal corresponding to whether input data is an information bit or a parity bit is supplied to the selector 93.

The control unit 94 supplies, to the selectors 71 and 74, a first select control signal of "0" corresponding to coding in the DVB-Like format or of "1" corresponding to coding in the ETRI format.

Also, the control unit 94 supplies, to the selector 92, a second select control signal corresponding to an output or non-output by the B matrix parity interleaver 91. Moreover, the control unit 94 supplies a third select control signal corresponding to an information bit or a parity bit to the selector 93.

The coding device 50 in the third embodiment is configured in the above manner.

<Generation of DVB-Like LDPC Code>

Generation of a DVB-Like LDPC code in the third embodiment will be described with reference to FIGS. 29A, 29B, and 29C.

In a case where the coding device 50 generates a DVB-Like LDPC code, the control unit 94 supplies a first select control signal of "0" corresponding to coding in the DVB-Like format to the selectors 71 and 74. Also, the control unit 94 supplies, to the selector 92, a second select control signal of "0" corresponding to non-output by the B matrix parity interleaver 91.

Figure 29A:
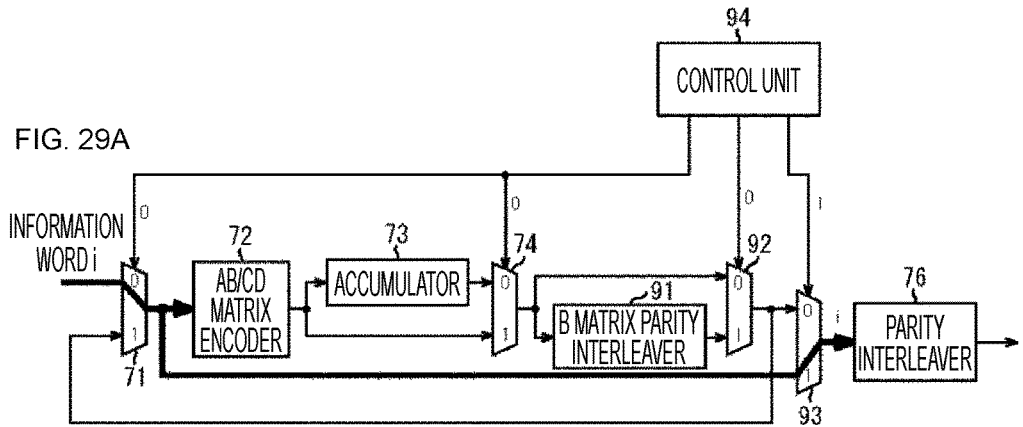
FIGS. 29A, 29B, and 29C are views for describing generation of a DVB-Like LDPC code in the third embodiment.

First, as illustrated in FIG. 29A, an information bit (information word) i as target data of LDPC coding is input into the selector 71. The information bit i input into the selector 71 is output to the AB/CD matrix encoder 72 and the selector 93.

A third select control signal of "1" corresponding to an information bit is supplied by the control unit 94 to the selector 93 at this time point. The selector 93 outputs the information bit i, which is supplied by the selector 71, to the parity interleaver 76 on the basis of the third select control signal.

After the output of the information bit i, the third select control signal output from the control unit 94 to the selector 93 is changed to a third select control signal of "0" corresponding to a parity bit.

Figure 29B:
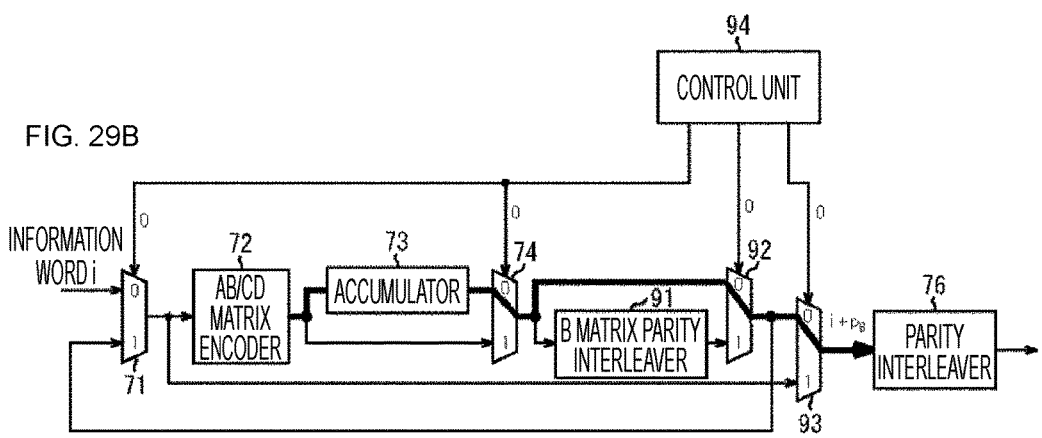

As illustrated in FIG. 29B, LDPC coding using a first parity check matrix HAB is executed with respect to the information bit i in the AB/CD matrix encoder 72 to which the information bit i is supplied by the selector 71, and integration processing of a parity bit of an LDPC code is executed in the accumulator 73, whereby an LDPC code $i+p_B$ is generated.

Since each of the first select control signal supplied to the selector 74, the second select control signal supplied to the selector 92, and the third select control signal supplied to the selector 93 is "0," the LDPC code $i+p_B$ output from the accumulator 73 is supplied to the parity interleaver 76.

Figure 29C:
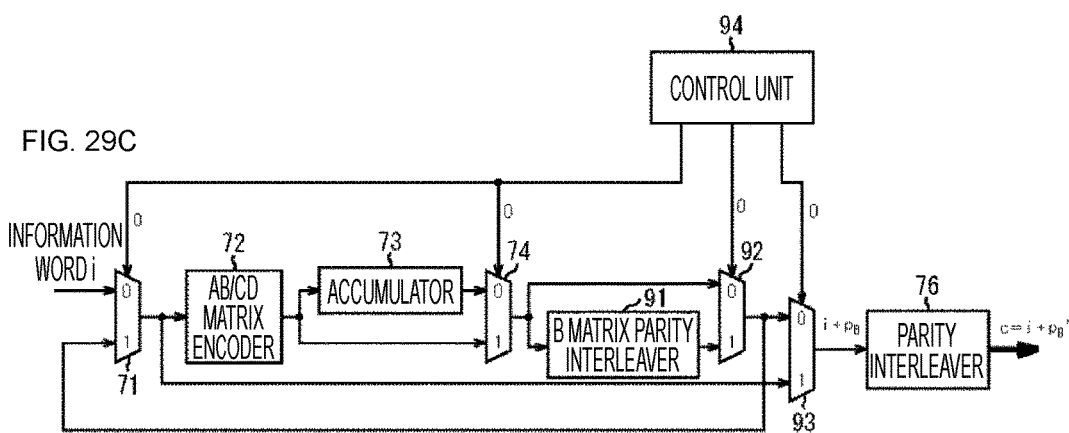

As illustrated in FIG. 29C, the parity interleaver 76 executes parity interleaving to interleave a parity bit $p_B$ of the supplied LDPC code $i+p_B$ to a position of a different parity bit, and outputs an LDPC code $i+p_B'$ after the parity interleaving to the outside as a code word c.

In the third embodiment, it is possible to generate and output a DVB-Like LDPC code in the above manner.

<Generation of LDPC Code in ETRI Format>

Next, generation of an LDPC code in the ETRI format in the third embodiment will be described with reference to FIGS. 30A, 30B, 30C, 31A, 31B, and 31C.

In the first stage in a case where the coding device 50 generates an LDPC code in the ETRI format, the control unit 78 supplies a first select control signal of "0" that is the same with a case of coding in the DVB-Like format to the selectors 71 and 74.

Figure 30A:
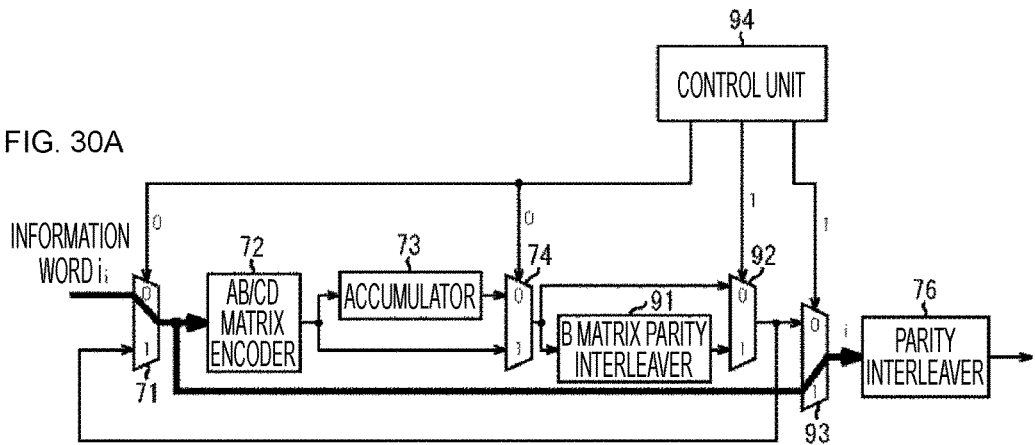
FIGS. 30A, 30B, and 30C are views for describing generation of an LDPC code in an ETRI format in the third embodiment.

First, as illustrated in FIG. 30A, an information bit (information word) i as target data of LDPC coding is input into the selector 71. The information bit i input into the selector 71 is output to the AB/CD matrix encoder 72 and the selector 93.

A third select control signal of "1" corresponding to an information bit is supplied by the control unit 94 to the selector 93 at this time point. The selector 93 outputs the information bit i, which is supplied by the selector 71, to the parity interleaver 76 on the basis of the third select control signal.

Figure 30B:
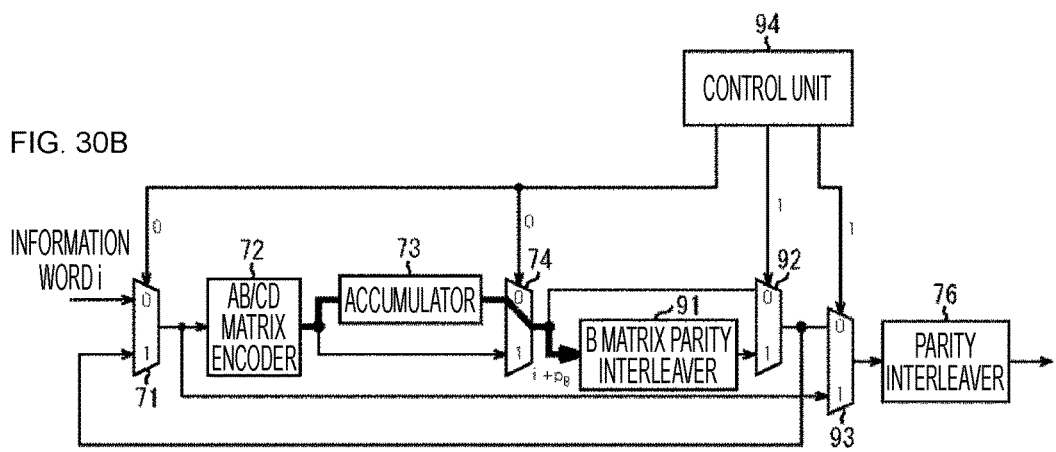

Also, as illustrated in FIG. 30B, LDPC coding using a first parity check matrix HAB is executed with respect to the information bit i in the AB/CD matrix encoder 72 to which the information bit i is supplied by the selector 71, and integration processing of a parity bit of an LDPC code is executed in the accumulator 73, whereby an LDPC code $i+p_B$ is generated.

Since the first select control signal supplied to the selector 74 is "0," the LDPC code $i+p_B$ output from the accumulator 73 is supplied to the B matrix parity interleaver 91.

That is, the B matrix parity interleaver 91 performs parity interleaving to interleave a parity bit $p_B$ of the LDPC code $i+p_B$, which is output from the accumulator 73, to a position of a different parity bit and outputs an LDPC code $i+p_B'$ after the parity interleaving to the selector 92.

To the selector 92 at this time point, a second select control signal of "1" corresponding to an output of the B matrix parity interleaver 91 is supplied by the control unit 94.

Figure 30C:
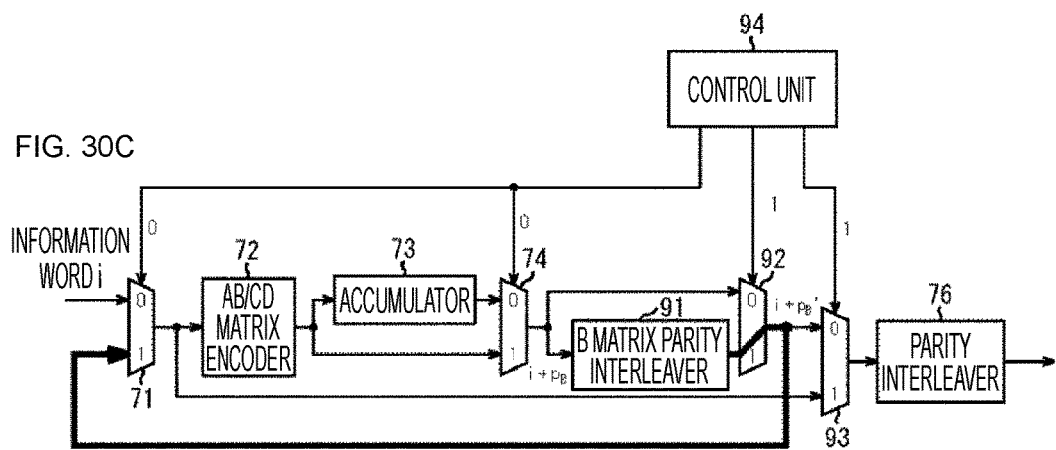

As illustrated in FIG. 30C, on the basis of the second select control signal of "1" corresponding to an output of the B matrix parity interleaver 91, the selector 92 selects and outputs the LDPC code $i+p_B'$ after the parity interleaving which code is output from the B matrix parity interleaver 91.

Output destinations of the selector 92 are the selector 71 and the selector 93. However, since the third select control signal of "1" corresponding to an information bit is supplied to the selector 93, an output from the selector 92 is not selected the selector 93.

Thus, as illustrated in FIG. 30C, the LDPC code $i+p_B'$ after the parity interleaving which code is output from the B matrix parity interleaver 91 is fed back to the selector 71 via the selector 92.

Figure 31A:
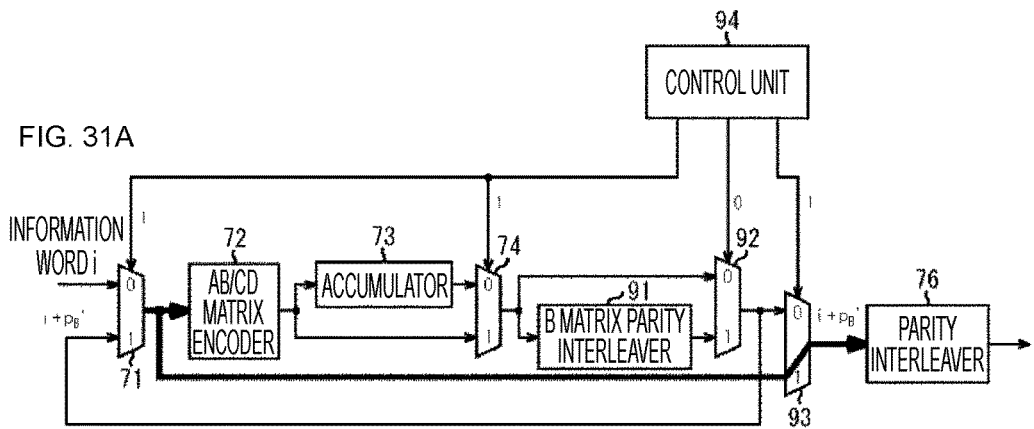
FIGS. 31A, 31B, and 31C are views for describing generation of an LDPC code in the ETRI format in the third embodiment.

As illustrated in FIG. 31A, the first select control signal supplied to the selectors 71 and 74 is changed from "0" corresponding to coding in the DVB-Like format into "1" corresponding to coding in the ETRI format until the LDPC code $i+p_B'$ after the parity interleaving is fed back to the selector 71. Also, the second select control signal supplied to the selector 92 is changed to a second select control signal of "0" corresponding to non-output of the B matrix parity interleaver 91.

On the basis of the first select control signal of "1" corresponding to coding in the ETRI format, the selector 71 outputs the fed-back and input LDPC code $i+p_B'$ after the parity interleaving to the AB/CD matrix encoder 72 and the selector 93.

On the basis of the third select control signal of "1" corresponding to an information bit, the selector 93 outputs the LDPC code $i+p_B'$ after the parity interleaving, the code being supplied by the selector 71, to the parity interleaver 76. After the output, the third select control signal supplied to the selector 93 is changed to a third select control signal of "0" corresponding to a parity bit.

Figure 31B:
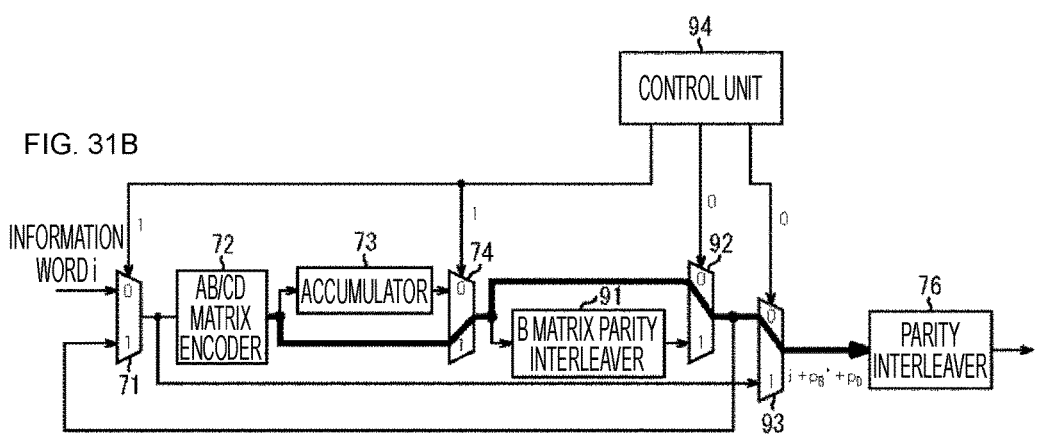

As illustrated in FIG. 31B, in the AB/CD matrix encoder 72 to which the LDPC code $i+p_B'$ after the parity interleaving is supplied by the selector 71, LDPC coding using a second parity check matrix HCD is executed with respect to the LDPC code $i+p_B'$ after the parity interleaving and an LDPC code $i+p_B'+p_D$ is generated.

The first select control signal of "1" corresponding to coding in the ETRI format is supplied to the selector 74. The second select control signal of "0" corresponding to non-output of the B matrix parity interleaver 91 is supplied to the selector 92. The third select control signal of "0" corresponding to a parity bit is supplied to the selector 93. As a result, the LDPC code $i+p_B'+p_D$ generated in the AB/CD matrix encoder 72 is supplied to the parity interleaver 76 via the selectors 74, 92, and 93.

Figure 31C:
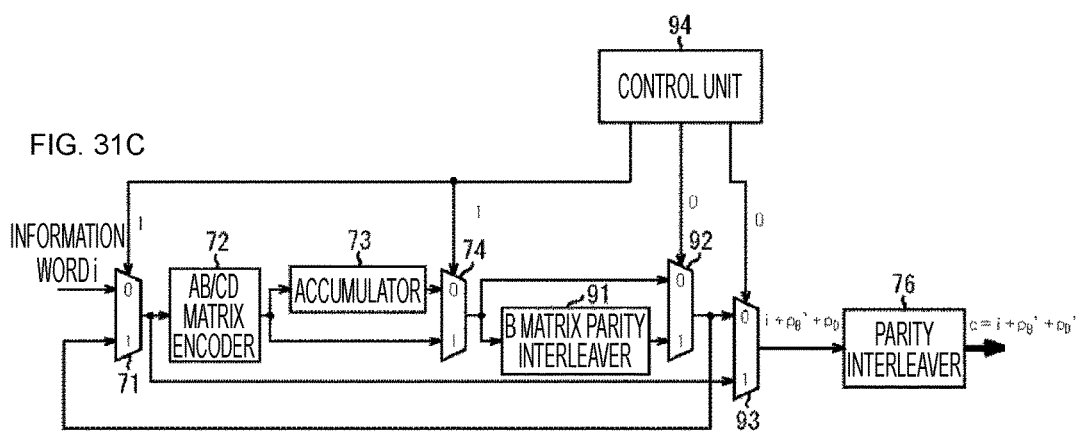

As illustrated in FIG. 31C, the parity interleaver 76 interleaves a parity bit $p_D$ of the LDPC code $i+p_B'+p_D$ and supplies an LDPC code $i+p_B'+p_D'$ after the parity interleaving to the outside as a code word c.

In the third embodiment, it is possible to generate and output an LDPC code in the ETRI format in the above manner.

Thus, it is possible to correspond to both of a DVB-Like LDPC code and an LDPC code in the ETRI format according to the third embodiment.

The above-described coding device 50 that generates a DVB-Like LDPC code and an LDPC code in the ETRI format can be applied, for example, to a device in a broadcast station which device transmits (digital) satellite broadcasting.

<Embodiment of Computer>

The series of above-described processing can be performed by hardware or by software. In a case where the series of processing is performed by software, a program included in the software is installed into a general computer or the like.

Figure 32:
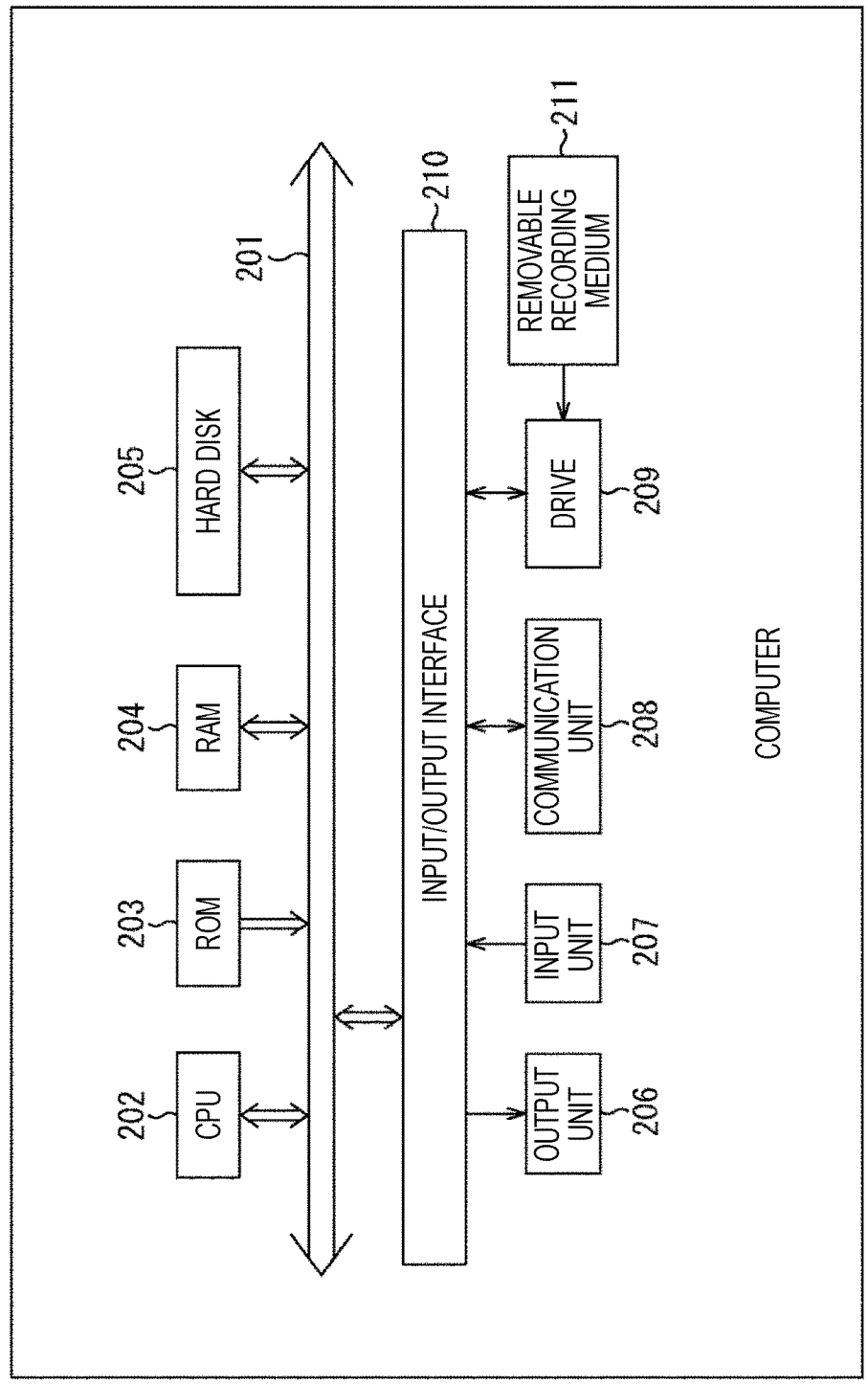

Thus, a configuration example of an embodiment of a computer into which a program to execute the series of above-described processing is illustrated in FIG. 32.

The program can be previously recorded in a hard disk 205 or a ROM 203 as a recording medium built in a computer.

Alternatively, the program can be temporarily or permanently stored (recorded) in a removable recording medium 211 such as a flexible disk, a compact disc read only memory (CD-ROM), a magneto optical (MO) disk, a digital versatile disc (DVD), a magnetic disk, or a semiconductor memory. Such a removable recording medium 211 can be provided as a so-called packaged software.

Note that other than being installed into a computer from the above-described removable recording medium 211, the program can be transferred from a download site to a computer in a wireless manner via a satellite for digital satellite broadcasting, or transferred to a computer in a wired manner via a network such as a local area network (LAN) or the Internet. The computer can receive the program, which is transferred in such a manner, in a communication unit 208 and can install the program into a built-in hard disk 205.

The computer includes a central processing unit (CPU) 202. An input/output interface 210 is connected to the CPU 202 via a bus 201. In a case where a command is input by operation by a user with respect to an input unit 207 including a keyboard, a mouse, a microphone, or the like via the input/output interface 210, the CPU 202 executes a program stored in the read only memory (ROM) 203 according to the command. Alternatively, the CPU 202 loads, into the random access memory (RAM) 204, a program stored in the hard disk 205, a program that is transferred from a satellite or a network, received in the communication unit 208, and installed into the hard disk 205, or a program read from a removable recording medium 211, which is attached to a drive 209, and installed into the hard disk 205 and executes the program. With this arrangement, the CPU 202 performs processing according to the above-described flowchart or processing performed by a configuration in the above-described block diagram. Then, if necessary, the CPU 202 outputs a result of the processing from an output unit 206 including a liquid crystal display (LCD), a speaker, or the like via the input/output interface 210 or transmits the result from the communication unit 208, and records the result into the hard disk 205.

Here, in the present specification, processing steps of describing a program of causing a computer to perform various kinds of processing are not necessarily performed in a time series in order described in a flowchart. Processing executed in parallel or individually (such as parallel processing or processing by object) is included.

Also, a program may be processed by one computer or may be processed in a distributed manner by a plurality of computers. Moreover, a program may be transferred to and executed by a remote computer.

Note that an embodiment of the present technology is not limited to the above-described embodiments and various modifications can be made within the spirit and the scope of the present technology.

For example, a configuration in which a part or whole of the plurality of above-described embodiments is combined may be employed.

For example, the present technology may include a configuration of cloud computing in which one function is divided by a plurality of devices through a network and processing is performed in cooperation.

Also, each step described in the above flowchart can be executed by one device or can be divided and executed by a plurality of devices.

Moreover, in a case where a plurality of kinds of processing is included in one step, the plurality of kinds of processing included in the one step can be executed by one device or can be divided and executed by a plurality of devices.

Note that an effect described in the present specification is just an example and not the limitation. There may be an effect other than what has been described in the present specification.

Note that the present technology may include the following configuration.

(1)
A coding device including: a first LDPC coding unit configured to generate an LDPC code of a predetermined information word by using a first parity check matrix; a first parity interleaving unit configured to interleave a parity bit of the LDPC code; and a second LDPC coding unit configured to generate an LDPC code in an ETRI format by using a second parity check matrix with respect to the LDPC code in which the parity bit is interleaved.

(2)
The coding device according to (1), in which the first LDPC coding unit and the second LDPC coding unit are configured by the same LDPC coding unit.

(3)
The coding device according to (2), in which the LDPC coding unit includes a coding unit configured to integrate the product of the information word and an information matrix of the first parity check matrix or a second parity check matrix corresponding to the information word, and an integration unit configured to generate a parity bit of the LDPC code by integrating a result of the integration by the coding unit.

(4)
The coding device according to (3), in which in a case of generating the LDPC code in the ETRI format, the LDPC coding unit executes processing by the coding unit twice, executes processing by the integration unit after the first processing, and does not execute the processing by the integration unit after the second processing.

(5)
The coding device according to any one of (2) to (4), in which the first parity interleaving unit also performs interleaving of a parity bit of the LDPC code in the ETRI format.

(6)
The coding device according to any one of (1) to (4), further including a second parity interleaving unit configured to interleave a parity bit of the LDPC code in the ETRI format.

(7)
The coding device according to (1), in which the first LDPC coding unit and the second LDPC coding unit are configured by different LDPC coding units.

(8)
A coding method including: a first LDPC coding step of generating an LDPC code of a predetermined information word by using a first parity check matrix; a parity interleaving step of interleaving a parity bit of the LDPC code; and a second LDPC coding step of generating an LDPC code in an ETRI format by using a second parity check matrix with respect to the LDPC code in which the parity bit is interleaved, in which it is switched after execution of the first LDPC coding step and the parity interleaving step whether to perform an output directly or to perform an output after execution of the second LDPC coding step.

REFERENCE SIGNS LIST

50 Coding device
51 AB matrix encoder
52 B matrix parity interleaver
53 CD matrix encoder
54 Selector
55 Parity interleaver
56 Control unit
71 Selector
72 AB/CD matrix encoder
73 Accumulator
74, 75 Selector
76 Parity interleaver
77 Selector
78 Control unit
91 B matrix parity interleaver
92, 93 Selector
94 Control unit
201 CPU
203 ROM
204 RAM
205 Hard disk
206 Output unit
207 Input unit
208 Communication unit
209 Drive
211 Removable recording medium

The invention claimed is:
1. A coding device, comprising:
circuitry configured to:
integrate product of an information word and an information matrix of a first parity check matrix corresponding to the information word;

generate a parity bit of a low density parity check (LDPC) code based on an integration of a result of the integration of product of the information word and the information matrix of the first parity check matrix;

generate the LDPC code of the information word based on the generated parity bit;

interleave the parity bit of the LDPC code to a position of a different parity bit; and generate an LDPC code in an Electronics and Telecommunications Research Institute (ETRI) format based on a second parity check matrix with respect to the LDPC code in which the parity bit is interleaved.

2. The coding device according to claim 1, wherein based on the generation of the LDPC code in the ETRI format, the circuitry is further configured to integrate the generated parity bit of the LDPC code based on a result of the integration of product of the information word and the information matrix of the second parity check matrix.

3. The coding device according to claim 1, wherein the circuitry is further configured to interleave the parity bit of the LDPC code in the ETRI format.

4. A coding method, comprising:

integrating product of an information word and an information matrix of a first parity check matrix corresponding to the information word;

generating a parity bit of a low density parity check (LDPC) code based on an integration of a result of the integration of product of the information word and the information matrix of the first parity check matrix;

generating the LDPC code of the information word based on the generated parity bit;

interleaving the parity bit of the LDPC code to a position of a different parity bit; and generating an LDPC code in an Electronics and Telecommunications Research Institute (ETRI) format by using a second parity check matrix with respect to the LDPC code in which the parity bit is interleaved.

* * * * *